United States Patent
Bates

(10) Patent No.: US 11,355,829 B2
(45) Date of Patent: Jun. 7, 2022

(54) VERTICAL SWITCHED FILTER BANK

(71) Applicant: Knowles Cazenovia, Inc., Cazenovia, NY (US)

(72) Inventor: David Bates, Fayetteville, NY (US)

(73) Assignee: KNOWLES CAZENOVIA, INC., Cazenovia, NY (US)

(*) Notice: Subject to any disclaimer, the term of this patent is extended or adjusted under 35 U.S.C. 154(b) by 0 days.

(21) Appl. No.: 16/128,467

(22) Filed: Sep. 11, 2018

(65) Prior Publication Data

US 2019/0081379 A1 Mar. 14, 2019

Related U.S. Application Data

(60) Provisional application No. 62/557,632, filed on Sep. 12, 2017.

(51) Int. Cl.
*H01P 5/16* (2006.01)
*H01P 1/20* (2006.01)
(Continued)

(52) U.S. Cl.
CPC ............ *H01P 5/16* (2013.01); *H01L 23/5387* (2013.01); *H01L 23/552* (2013.01); *H01L 23/66* (2013.01);
(Continued)

(58) Field of Classification Search
CPC .......... H01P 5/16; H01P 3/081; H01P 11/003; H01P 1/20; H05K 1/147; H05K 3/4691;
(Continued)

(56) References Cited

U.S. PATENT DOCUMENTS 5,235,208 A 8/1993 Katoh
6,232,659 B1 * 5/2001 Clayton ............... H01L 23/13
257/723
(Continued)

FOREIGN PATENT DOCUMENTS

EP 0 503 200 A2 9/1992
EP 2 157 838 A1 2/2010
GB 2 294 363 A 4/1996

OTHER PUBLICATIONS

International Search Report and Written Opinion, PCT/US2018/050529 (dated Dec. 5, 2018).
(Continued)

*Primary Examiner* — Stephen E. Jones
*Assistant Examiner* — Kimberly E Glenn
(74) *Attorney, Agent, or Firm* — Foley & Lardner LLP

(57) ABSTRACT

A microwave or radio frequency (RF) device includes stacked printed circuit boards (PCBs) mounted on a flexible PCB having at least one ground plane and a signal terminal. Each of the stacked PCBs includes through-holes the sidewalls of which are coated with a conductive material. Microwave components are mounted on the flexible PCB within the through-holes, such that signal terminals of the components bond to signal terminals of respective through-holes. A conductive cover is mounted on the PCBs such that the cover is in electrical contact with the ground plane of the flexible PCB through the conductive material, forming shielding cavities around the components. The flexible PCB is folded such that the cover of one PCB faces the cover of the second PCB. The flexible PCB includes striplines or microstrips that carry RF or microwave signals to the signal terminals.

20 Claims, 14 Drawing Sheets

(51) Int. Cl.

| | | |
|---|---|---|
| *H01P 11/00* | (2006.01) | |
| *H01P 3/08* | (2006.01) | |
| *H01L 25/065* | (2006.01) | |
| *H01L 23/538* | (2006.01) | |
| *H05K 3/46* | (2006.01) | |
| *H01L 23/66* | (2006.01) | |
| *H01L 23/552* | (2006.01) | |
| *H05K 1/14* | (2006.01) | |
| *H01L 25/10* | (2006.01) | |
| *H05K 1/02* | (2006.01) | |
| *H05K 1/11* | (2006.01) | |
| *H05K 3/00* | (2006.01) | |
| *H05K 3/22* | (2006.01) | |
| *H05K 3/32* | (2006.01) | |
| *H05K 3/36* | (2006.01) | |
| *H05K 1/18* | (2006.01) | |

(52) U.S. Cl.
CPC ........ *H01L 25/0655* (2013.01); *H01L 25/105* (2013.01); *H01P 1/20* (2013.01); *H01P 3/081* (2013.01); *H01P 11/003* (2013.01); *H05K 1/028* (2013.01); *H05K 1/0243* (2013.01); *H05K 1/115* (2013.01); *H05K 1/144* (2013.01); *H05K 1/147* (2013.01); *H05K 3/0011* (2013.01); *H05K 3/22* (2013.01); *H05K 3/32* (2013.01); *H05K 3/361* (2013.01); *H05K 3/4691* (2013.01); *H01L 2223/6627* (2013.01); *H01L 2223/6683* (2013.01); *H01L 2224/16227* (2013.01); *H01L 2225/107* (2013.01); *H01L 2225/1047* (2013.01); *H01L 2924/15313* (2013.01); *H01L 2924/3025* (2013.01); *H01L 2924/351* (2013.01); *H05K 1/0216* (2013.01); *H05K 1/189* (2013.01); *H05K 3/363* (2013.01); *H05K 2201/041* (2013.01); *H05K 2201/042* (2013.01); *H05K 2201/058* (2013.01); *H05K 2201/1006* (2013.01); *H05K 2201/10053* (2013.01)

(58) Field of Classification Search
CPC ............ H05K 3/361; H05K 3/32; H05K 3/22; H05K 3/0011; H05K 1/144; H05K 1/115; H05K 1/028; H05K 1/0243; H05K 1/0216; H05K 2201/10053; H05K 2201/042; H05K 2201/1006; H05K 3/363; H05K 1/189; H05K 2201/058; H05K 2201/041; H01L 25/105; H01L 23/552; H01L 23/66; H01L 23/5387; H01L 25/0655; H01L 2225/1047; H01L 2924/3025; H01L 2223/6627; H01L 2924/351; H01L 2924/15313

USPC ........................................................ 333/246
See application file for complete search history.

(56) References Cited

U.S. PATENT DOCUMENTS

| | | | |
|---|---|---|---|
| 6,487,083 | B1 | 11/2002 | Kwong |
| 10,531,564 | B2 | 1/2020 | Zargar et al. |
| 10,770,776 | B2 | 9/2020 | Bates |
| 2003/0102249 | A1 | 6/2003 | Lee |
| 2005/0062141 | A1* | 3/2005 | Salta, III ............. H01L 23/3121 257/678 |
| 2007/0059918 | A1* | 3/2007 | Jung .................... H05K 3/4691 438/618 |
| 2008/0018391 | A1 | 1/2008 | Bates |
| 2008/0211601 | A1 | 9/2008 | Bates |
| 2009/0231064 | A1 | 9/2009 | Bates et al. |
| 2012/0011713 | A1 | 1/2012 | Zeng |
| 2013/0342287 | A1 | 12/2013 | Randall et al. |
| 2014/0210066 | A1* | 7/2014 | Nagano .................. H01L 23/04 257/698 |
| 2014/0252569 | A1* | 9/2014 | Ikuma .................. H01L 23/045 257/659 |
| 2016/0174378 | A1* | 6/2016 | Johnson ................ H05K 1/147 361/760 |
| 2018/0183130 | A1 | 6/2018 | Bates |
| 2019/0081378 | A1 | 3/2019 | Bates |
| 2019/0081380 | A1 | 3/2019 | Bates |
| 2020/0021030 | A1 | 1/2020 | Bates |
| 2020/0259263 | A1 | 8/2020 | Dani |
| 2020/0358160 | A1 | 11/2020 | Alton |
| 2020/0403286 | A1 | 12/2020 | Burdick |

OTHER PUBLICATIONS

International Search Report and Written Opinion, PCT/US2018/050530 (dated Dec. 5, 2018).
International Search Report and Written Opinion, PCT/US2018/050534 (dated Dec. 5, 2018).

\* cited by examiner

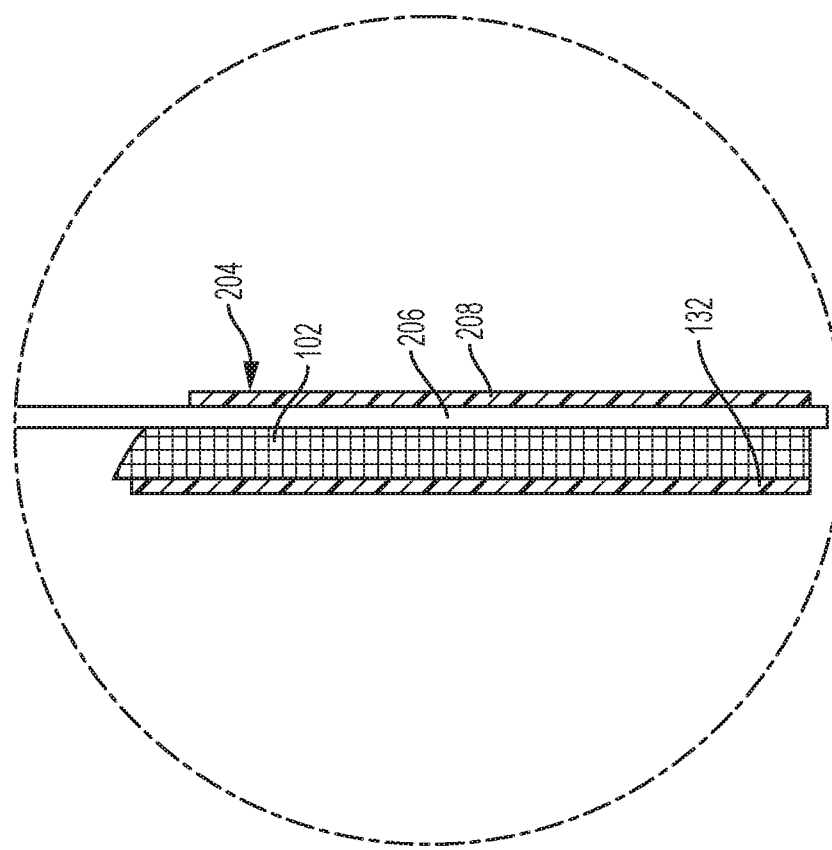
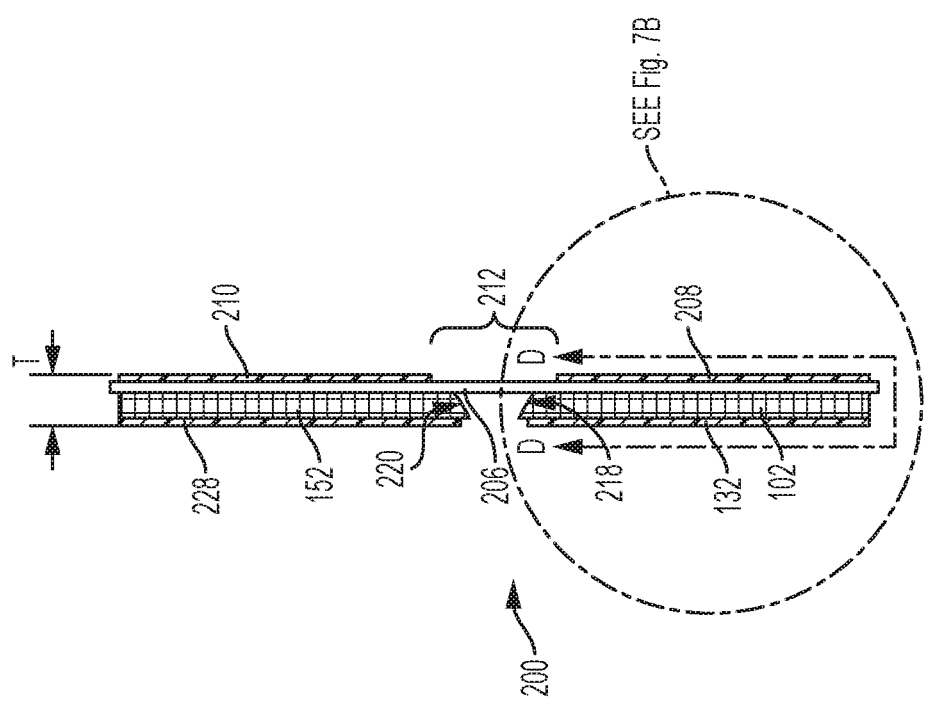

VERTICAL SWITCHED FILTER BANK

CROSS REFERENCE TO RELATED APPLICATIONS

This application claims priority to U.S. Provisional Application No. 62/557,632, filed Sep. 12, 2017, entitled "Vertical Switched Filter Bank," the entire contents of which are incorporated herein by reference.

BACKGROUND

Microwave and RF circuits can be implemented on circuit boards using microwave and RF components and transmission lines. The sizes of the printed circuit boards can be affected by large distances between neighboring components and transmission lines applied in order to maintain signal isolation.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIGS. 7A and 7B show a side view and an expanded view of a bottom printed circuit board of the third example microwave device shown in FIG. 5.

Figure 1:
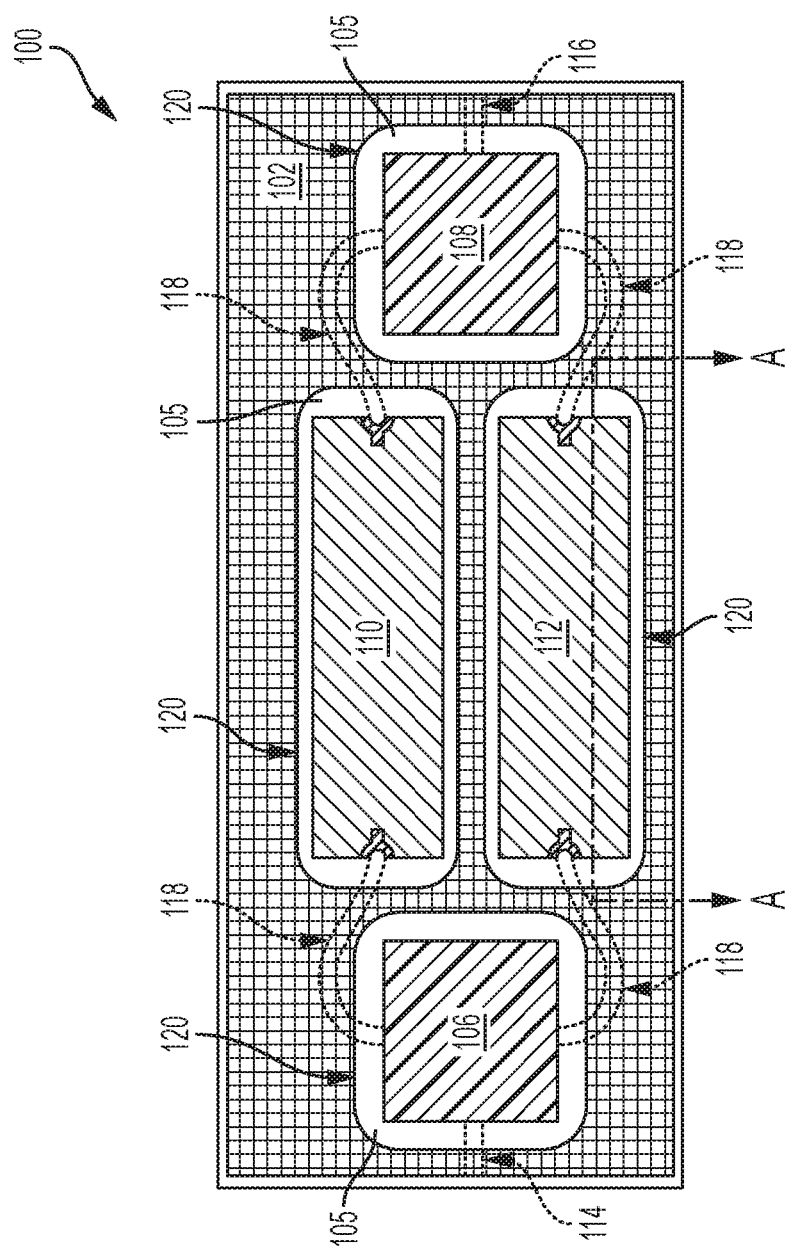
FIG. 1 shows a top view of a first example microwave device according to embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The present disclosure describes devices and techniques for a microwave or radio frequency (RF) device. The device includes a printed circuit boards (PCB) mounted on a substrate having at least one ground plane and a signal terminal. The PCB includes through-holes the sidewalls of which are coated with a conductive material. Microwave components are mounted on the substrate within the through-holes, such that signal terminals of the components bond to signal terminals of respective through-holes. A conductive cover is mounted on the PCB such that the cover is in electrical contact with the ground plane of the substrate through the conductive material, forming shielding cavities around the components.

In one or more embodiments, the substrate is a flexible PCB layer including striplines and/or microstrip transmission lines, and at least two PCBs are bonded to the flexible PCB such that the at least two PCBs are stacked. The flexible PCB is folded such that the cover of one PCB faces the cover of the second PCB. The striplines carry RF or microwave signals to the signal terminals, and are shielded by at least two ground planes in the flexible PCB.

In one aspect, this disclosure describes a microwave device. The microwave device includes a first substrate having a top surface, the top surface having at least one ground terminal and at least one signal terminal of the first substrate. The microwave device further includes a second substrate having a first surface and an opposing second surface, the second substrate disposed over the top surface of the first substrate, the second substrate having a through-hole extending between the first surface and the second surface. The microwave device further includes a conductive material covering sidewalls of the through-hole, and covering at least a portion of the first surface and at least a portion of the second surface at rim edges of the through-hole, the conductive material on the first surface in electrical contact with the at least one ground terminal of the first substrate. The microwave device further includes a microwave component disposed within the through-hole and on the top surface of the first substrate, the microwave component having a ground terminal in electrical contact with the at least one ground terminal of the first substrate, and a signal terminal in electrical contact with the at least one signal terminal of the first substrate. The microwave device also includes a cover at least partially covering the through-hole, the cover including a conductive surface in electrical contact with the conductive material covering at least a portion of the second surface of the second substrate.

In some embodiments, the microwave device further includes at least one transmission line coupled to the at least one signal terminal, and a dielectric material in the first substrate covering at least a portion of the at least one transmission line. In some embodiments, the microwave device includes a first ground plane and a second ground plane disposed on the first substrate, the at least one transmission line disposed between the first ground plane and the second ground plane. In some embodiments, the microwave device includes at least one microstrip transmission line coupled to the at least one signal terminal, the at least one microstrip transmission line disposed over the top surface of the first substrate. In some embodiments, a cavity extends over the at least one microstrip transmission line and is located below the first surface of the second substrate. In some embodiments, the microwave device also includes a ground plane disposed on the first substrate, the at least one microstrip transmission line separated from the ground plane by a dielectric material. In some embodiments, the conductive material covers all surfaces of the sidewalls of the through-hole.

In some embodiments, the conductive material comprises a layer of conductive material having a mesh structure. In some embodiments, the microwave device includes a first ground plane disposed over the top surface of the first substrate, the first ground plane, the conductive material, and the cover forming a shielding enclosure for the microwave component. In some embodiments, the microwave component has a thickness between 0.045 inches to 0055 inches.

In another aspect, this disclosure discusses a microwave device including a first substrate having a first ground plane. The microwave device further includes a second substrate including a plurality of through-holes having conductive sidewalls. The microwave device also includes a plurality of microwave components disposed over the first substrate within the respective through-holes. The microwave device also includes a conductive cover disposed over the second substrate and positioned to at least partially cover the plurality of through-holes, the cover electrically coupled to the first ground plane via the conductive sidewalls.

In some embodiments, the first substrate includes a plurality of signal terminals, each signal terminal of the plurality of signal terminals coupled to a signal terminal of a respective microwave component of the plurality of microwave components. In some embodiments, the microwave device further includes a plurality of transmission lines coupled to a respective signal terminal of the plurality of microwave components, and a dielectric material disposed in the first substrate covering at least a portion of each of the plurality of transmission lines. In some embodiments, the microwave device also includes a second ground plane disposed on the first substrate, wherein the plurality of transmission lines is disposed between the first ground plane and the second ground plane. In some embodiments, the microwave device further includes a plurality of microstrip transmission lines coupled to a respective signal terminal of the plurality of microwave components, at least one of the plurality of microstrip transmission lines disposed over a top surface of the first substrate, the top surface of the first substrate facing the second substrate.

In some embodiments, the microwave device also includes a plurality of cavities each extending over a respective one of the plurality of microstrip transmission lines and located below a first surface of the second substrate. In some embodiments, the microwave device also includes a ground plane disposed on the first substrate, the plurality of microstrip transmission lines separated from the ground plane by a dielectric material. In some embodiments, the plurality of microwave components are configured to operate within a frequency range of 300 MHz to 300 GHz. In some embodiments, the conductive sidewalls include a layer of conductive material having a mesh shaped structure. In some embodiments, the plurality of microwave components have a thickness between 0.045 inches to 0055 inches.

In another aspect, this disclosure describes a microwave device. The microwave device includes a flexible printed circuit board (PCB). The microwave device also includes a first PCB including a first plurality of through-holes, the first PCB bonded to the flexible PCB. The microwave device also includes a first plurality of electrical components bonded to the flexible PCB within respective first plurality of through-holes. The microwave device also includes a first cover covering the first PCB. The microwave device further includes a second PCB including a second plurality of through-holes, the second PCB bonded to the flexible PCB and spaced apart from the first PCB exposing a bend portion of the flexible PCB, the second PCB including a second conductive layer covering sidewalls of the second plurality of through-holes. The microwave device also includes a second plurality of electrical components bonded to the flexible PCB within respective second plurality of through-holes. The microwave device further includes a second cover covering the second PCB and making electrical contact with the second conductive layer, where the second PCB is stacked on the first PCB such that the first cover faces the second cover.

In some embodiments, the microwave device further includes a first rigid layer disposed on a side of the flexible PCB opposing to a side on which the first PCB is disposed. In some embodiments, the first cover and the second cover comprise stainless steel. In some embodiments, the microwave device further includes an adhesive layer disposed between the first cover and the second cover. In some embodiments, the first PCB includes a first curved portion adjacent to the bend portion of the flexible PCB, and the second PCB includes a second curved portion adjacent to the bend portion of the flexible PCB. In some embodiments, the first curved portion and the second curved portion conform to a curvature of the bend portion of the flexible PCB. In some embodiments, the microwave device further includes an adhesive layer disposed between the first curved portion of the first PCB and the bend portion of the flexible PCB.

In some embodiments, the flexible PCB includes at least one signal terminal coupled to at least one electrical component from the first plurality of electrical components and the second plurality of electrical components, at least one transmission line coupled to the at least one signal terminal, and a dielectric material covering at least a portion of the at least one transmission line. In some embodiments, the flexible PCB has at least one ground plane, the at least one ground plane including a first ground plane and a second ground plane, and wherein the at least one transmission line is disposed between the first ground plane and the second ground plane. In some embodiments, the flexible PCB includes at least one signal terminal coupled to at least one electrical component from the first plurality of electrical components and the second plurality of electrical components, at least one microstrip transmission line coupled to the at least one signal terminal.

In some embodiments, the first PCB includes at least one cavity extending over at least a portion of a respective at least one microstrip transmission line, and includes a first conductive layer covering sidewalls of the first plurality of through-holes, wherein the first conductive layer covers at least a portion of sidewalls of the at least one cavity. In some embodiments, the flexible PCB has at least one ground plane, and the first PCB includes a dielectric layer separating the at least one microstrip transmission line from the at least one ground plane. In some embodiments, the dielectric layer has a dielectric constant between 1.5 and 3.5. In some embodiments, the dielectric layer has a dielectric loss tangent value between 0.001 and 0.002. In some embodiments, a thermal expansion coefficient of the first PCB, the second PCB and the flexible PCB are equal. In some embodiments, the bend portion is a first bend portion, and the microwave device further includes a third PCB including a third plurality of through-holes, the third PCB bonded to the flexible PCB and spaced apart from the second PCB exposing a second bend portion of the flexible PCB, a third plurality of electrical components bonded to the flexible PCB within respective third plurality of through-holes, and a third cover covering the third PCB, where the third PCB is stacked below the first PCB and the second PCB such that at least a portion of the first PCB is disposed between the second PCB and the third PCB.

In some embodiments, an area of the second bend portion is greater than an area of the first bend portion. In some embodiments, the first PCB includes a first conductive layer covering sidewalls of the first plurality of through-holes, and the first conductive layer comprises a layer of conductive material having a mesh structure. In some embodiments, the first plurality of electrical components and the second plurality of electrical components include microwave components. In some embodiments, the first plurality of electrical components and the second plurality of electrical components have a thickness between 0.045 inches and 0.055 inches.

In another aspect, this disclosure describes a method. The method includes providing a flexible printed circuit board (PCB). The method also includes providing a first PCB having a first plurality of through-holes and a first conductive layer covering sidewalls of the first plurality of through-holes. The method further includes providing a second PCB having a second plurality of through-holes and a second conductive layer covering sidewalls of the second plurality of through-holes. The method further includes bonding the first PCB and the second PCB to the flexible PCB, the first PCB spaced apart from the second PCB exposing a bend portion of the flexible PCB. The method also includes disposing a first cover on the first plurality of through-holes, disposing a second cover on the second plurality of through-holes, and folding the flexible PCB along the bend portion such that the first PCB and the second PCB are stacked.

In some embodiments, the method further includes folding the flexible PCB such that the first cover faces the second cover. In some embodiments, the method also includes providing the first PCB having a curved portion adjacent to the bend portion of the flexible PCB, the curved portion having a curvature that conforms to a curvature of the bend portion when the first PCB and the second PCB are stacked. In some embodiments, the method also includes bonding a first plurality of electrical components to the flexible PCB within the respective first plurality of through-holes. In some embodiments, the method further includes providing the flexible PCB with a first ground plane, a second ground plane, and at least one transmission line disposed between the first ground plane and the second ground plane, and forming an electrical contact between a first signal terminal of at least one electrical component of the first plurality of electrical components and the at least one transmission line.

In some embodiments, the method further includes providing the flexible PCB with at least one microstrip transmission line, a first ground plane, and a dielectric separating the at least one microstrip transmission line and the first ground plane, and forming an electrical contact between a first signal terminal of the at least one electrical component of the first plurality of electrical components and the microstrip transmission line. In some embodiments, the method includes forming at least one cavity in a first surface of the first PCB, the at least one cavity positioned to extend over the at least one microstrip transmission line on the flexible PCB. In some embodiments, the method further includes coating sidewalls of the at least one cavity with the conductive material.

In some embodiments, the method further includes providing the flexible PCB with a ground plane positioned below the first PCB and the second PCB, forming an electrical contact between the first cover and the ground plane via the first conductive layer covering sidewalls of the first plurality of through-holes, and forming an electrical contact between the second cover and the ground plane via the second conductive layer covering sidewalls of the second plurality of through-holes. In some embodiments, the method further includes disposing a first rigid layer and a second rigid layer on a side of the flexible PCB that is opposite to a side over which the first PCB and the second PCB are bonded, the first rigid layer and the second rigid layer aligned with the first PCB and the second PCB respectively.

In another aspect, this disclosure discusses a method. The method includes providing a first substrate having at least one ground terminal. The method further includes providing a second substrate having a first surface and an opposing second surface and having a through-hole extending between the first surface and the second surface. The method also includes coating sidewalls, and a portion of the first surface and a portion of the second surface at rim edges of the through-hole with a conductive material. The method also includes bonding the second substrate to the first substrate such that the conductive material on the first surface of the second substrate makes electrical contact with the at least one ground terminal. The method further includes bonding a microwave component to the first substrate within the through-hole such that a ground terminal of the microwave component makes electrical contact with the at least one ground terminal of the first substrate. The method also includes bonding a cover to the second substrate, the cover at least partially covering the through-hole and making electrical contact with the conductive material covering at least a portion of the second surface of the second substrate.

In some embodiments, the method further includes bonding the microwave component to the first substrate such that a signal terminal of the microwave component makes electrical contact with a transmission line in the first substrate. In some embodiments, the method also includes providing the first substrate with a first ground plane, a second ground plane, and the transmission line disposed between the first ground plane and the second ground plane. In some embodiments, the method further includes providing the first substrate with at least one microstrip transmission line, and bonding the microwave component to the first substrate such that a signal terminal of the microwave component makes electrical contact with a the microstrip transmission line. In some embodiments, the method also includes providing the first substrate with at least one microstrip transmission line disposed over a surface of the first substrate, and forming at least one cavity in the first surface of the substrate, the at least one cavity positioned to extend over the at least one microstrip transmission line disposed over the surface of the first substrate. In some embodiments, the method further includes coating sidewalls of the at least one cavity with the conductive material. In some embodiments, the method also includes providing the first substrate with the at least one microstrip transmission line separated from a ground plane by a dielectric material.

FIG. 1 shows a top view of a first example microwave device 100. The first example microwave device 100 includes a printed circuit board (PCB) 102, a substrate 105, an input switch 106, an output switch 108, a first filter 110, and a second filter 112. The first example microwave device 100 also includes an input interconnect 114 connected to an input port of the input switch 106, an output interconnect 116 connected to an output port of the output switch 108, and additional interconnects 118 connecting each end of the first and second filters 110 and 112 to the input switch 106 or the output switch 108. While not shown in FIG. 1, the first example microwave device 100 also includes a cover (discussed below in relation to FIG. 2). The interconnects mentioned above can be transmission lines or paths capable of carrying high-frequency signals, such as radio-frequency (RF) signals and microwave signals. One or more of the interconnects mentioned above can be implemented using striplines or waveguides.

The first example microwave device 100 can provide signal processing for an input RF or microwave signal input at the input interconnect 114. In particular, the first example microwave device 100 can allow a user to select one of the first filter 110 and the second filter 112 to filter the input signal. The input switch 106 can be configured to direct the input signal to input terminals of either the first filter 110 or the second filter 112. Similarly, the output switch 108 can be configured to connect the output of the selected filter to the output interconnect 116. The first example microwave device 100 can also include other microwave devices and components such amplifiers, mixers, attenuators, switches, etc. One or more of the microwave devices or components can be implemented in monolithic microwave integrated circuits (MMICs). The first and second filters 110 and 112 can be thin-film microstrip filters having a high dielectric constant (of about 20 to about 26 or about 23), temperature stable, and low loss ceramic. This allows the filters to be small, high performance, and capable of being surface mounted. The high dielectric constant can provide excellent electro-magnetic field confinement, resulting in a reduction in the size of the microwave devices for a given operating power. The reduction in size of the devices, in turn, enables employing low profile microwave devices having low thickness (about 0.045 inches to about 0.055 inches or about 0.05 inches). Such low profile microwave devices readily lend themselves to thin-film manufacturing processes. The precision, predictability and repeatability of the thin-film based first and second filters 110 and 112 enables a no-tune filter module. In particular, the filter modules are not based on filters which are assemblies of discrete elements which are individually tuned due to lack of discrete element precision and assembly variables, resulting in variable and unpredictable filter scattering parameters. These variations in performance can lead to further variation and technician tuning at the module level and consequently high unit cost. The thin-film first and second filters 110 and 112 can avoid variations and high cost. Each of the first and second filters 110 and 112 can have a length of about 0.35 inches to about 0.45 inches or about 0.4 inches, and a width of about 0.095 inches to about 0.15 inches, or about 0.1 inches.

Figure 2:
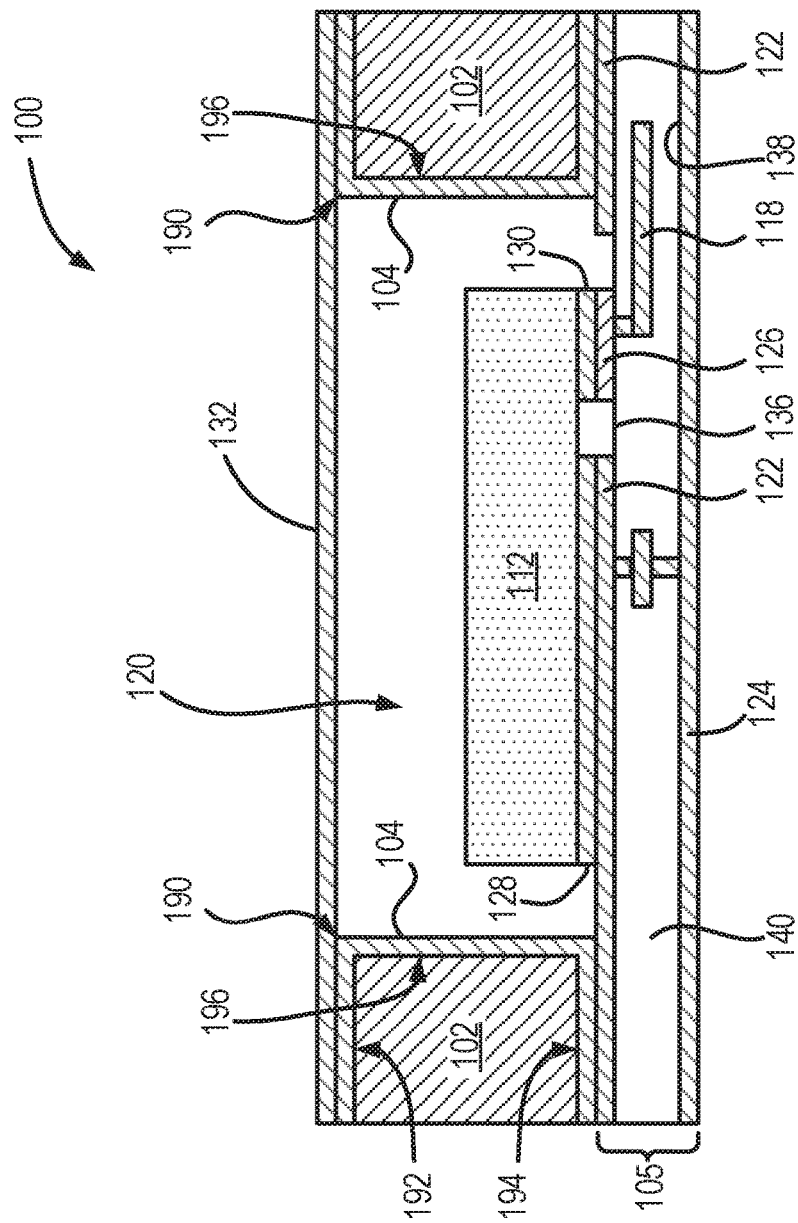
FIG. 2 shows a cross-sectional view of the first example microwave device shown in FIG. 1.

FIG. 2 shows a cross-sectional view of the first example microwave device 100 along the axis A-A indicated in FIG. 1. FIG. 2 shows the substrate 105, the printed circuit board 102, and the second filter 112. The substrate 105 can include one or more stripline interconnecting impedance controlled transmission lines that are shielded. The substrate 105 can be rigid or flexible. To provide low loss and improved impedance precision, the substrate 105 can use dielectric materials having low dielectric constant $\varepsilon_r$, such as about 1.5 to about 3.5 or about 2.5, and low dielectric loss tangent (tan δ) value of about 0.001 to about 0.002 or about 0.0015. The substrate 105 includes a top ground plane 122, a bottom ground plane 124, a dielectric layer 140 separating the top ground plane 122 and the bottom ground plane 124, and a signal interconnect 118 coupled, through a via, to a contact pad 126 on the surface of the substrate 105 facing the second filter 112. Specifically, the top ground plane 122 and the contact pad 126 can be formed on or embedded in a top surface 136 of the substrate 105 and the bottom ground plane 124 can be formed on or embedded in a bottom surface 138 of the substrate 105. While not shown, a portion, or the entirety, of each of the input interconnect 114, the output interconnect 116 and the interconnects 118 can be formed in the substrate 105.

The second filter 112 includes a ground terminal 128 and a signal terminal 130 disposed on a base of the filter 112. The ground terminal 128 makes electrical contact with the top ground plane 122, while the signal terminal 130 makes electrical contact with the contact pad 126. In one or more embodiments, the ground terminal 128 and the signal terminal 130 can be soldered to the top ground plane 122 and the contact pad 126, respectively.

Referring to FIG. 1, the PCB 102 defines through-holes 120 within which the input switch 106, the output switch 108, the first filter 110 and the second filter 112 are placed. The through-holes extend between a top surface 192 and a bottom surface 194 of the PCB 102. The PCB 102 can be a dual plated PCB, where both the first side 192 and the second side 194 of the PCB 102 are plated with a conducting material, such as copper or aluminum. In some embodiments, certain or limited portions of the sides of the PCB 102 are plated or covered with the conducting material, for example, portions at the rim edges 190 of the through-holes 120. The through-holes 120 also define sidewalls 196 in the PCB 102. These sidewalls 196 also can be covered with a conducting material such as copper or aluminum, which can conductively couple to the conducting material plated on the sides of the PCB 102, for example along the rim edges 190 of the through-holes 120. As shown in the example embodiment of FIG. 2, the sidewalls 196 of the PCB 102 within the through-holes 120, the top surface 192 of the PCB 102 and the bottom surface 194 of the PCB 102 are covered with a conductive material 104. The conductive material 104 on the sidewalls 196 of the PCB 102 within the through-holes 120 can be of a different composition or thickness that that of the conducting material on the top and bottom surfaces 192 and 194 of the PCB 102. The conductive material 104 on the sidewalls 196 can enable a conductive path between the conductive material 104 on the top surface 192 of the PCB 102 and the bottom surface 194 of the PCB 102. In some implementations, the conductive material 104 may at least partially cover the sidewalls. In some implementations, the conductive material 104 may entirely cover the sidewalls.

The conductive material on the bottom surface of the PCB 102 can make electrical contact with the ground plane 122 of the substrate 105, while the conductive material on the top surface of the PCB 102 can make electrical contact with a cover 132. The cover 132 can include a conductive material such as copper, aluminum, or stainless steel. In some implementations, the cover 132 can be coated or plated with nickel or gold. The conductive material 104 on the PCB 102 provides electrical contact between the cover 132 and the ground plane 122 on the substrate 105. The ground plane 122 in combination with the conductive material 104, and the cover 132 can provide a shielded enclosure for the second filter 112. Similar shielded enclosures can also be provided for the first filter 110, the input switch 106 and the output switch 108. Shielding the first filter 110 and the second filter 112 allows maintaining signal isolation and high fidelity.

In one or more embodiments, the PCB 102 can include an array or configuration of the through-holes 120 to accommodate RF and microwave components and devices. Each of the through-holes in the array can have a conductive material, such as the conductive material 104, which provides a conductive path between the conductive cover 132 and the ground plane 122 of the substrate, thereby forming a shielded cavity within the through-hole.

Figure 3:
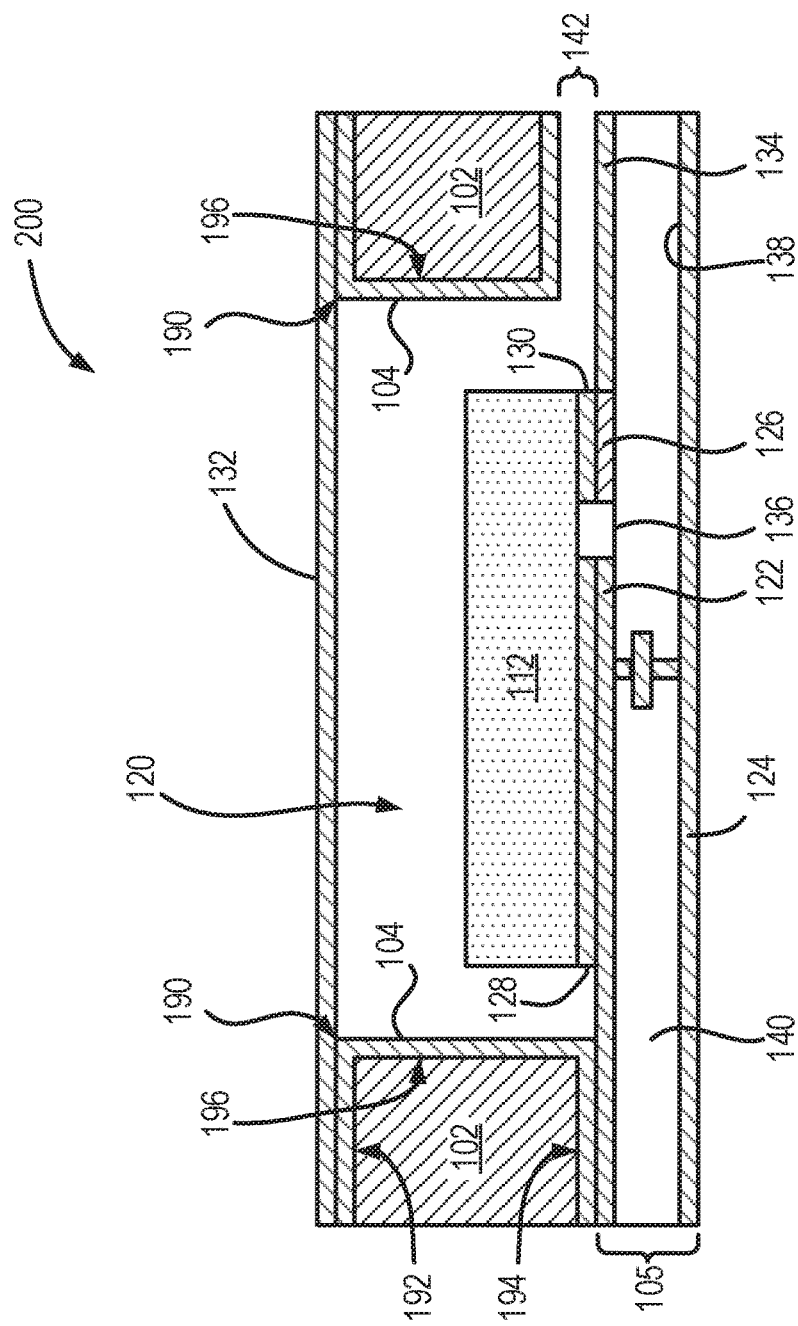
FIG. 3 shows a cross-sectional view of a second example microwave device according to embodiments of the present disclosure.

FIG. 3 shows a cross-sectional view of a second example microwave device 200. The microwave device 200 shown in FIG. 3 is in many aspects similar to the first example microwave device 100 shown in FIG. 2. To that extent, similar features are referred to with same reference numerals. Unlike the first example microwave device 100 shown in FIG. 1, which includes a signal interconnect 118 that may be a stripline transmission line, the second microwave device 200 shown in FIG. 3 includes a microstrip transmission line 134. The microstrip transmission line 134 can be formed on the side of the substrate 105 that faces the PCB 102. The microstrip transmission line 134 can be electrically connected to the contact pad 126, which, in turn, is electrically connected to the signal terminal 130 of the second filter 112. The microstrip transmission line 134 can be separated from the bottom ground plane 124 by the dielectric layer 140. On the surface of the substrate 105, the microstrip transmission line 134 can be formed on the same plane as the top ground plane 122 and can be separated from the top ground plane 122 by an air gap, the dielectric layer 140 or by some other dielectric material.

The PCB 102 can include a cavity or a tunnel 142 that extends over the microstrip transmission line 134. The cavity 142 can extend over an entire length of the microstrip transmission line 134. The cavity 142 can be formed in the bottom surface 194 of the PCB 102, and can extend laterally from the sidewall 196 of the through-hole 120. The sidewalls of the cavity 142 can be coated with the conductive material 104. In some instances, the sidewalls of the cavity 142 can be completely covered with the conductive material 104. In some instances only a portion of the sidewalls of the cavity 142 can be covered with the conductive material 104. In some instances, the conductive material 104 can form a mesh like structure on the sidewalls of the cavity 142. The mesh can include an interlace structure formed from the conductive material 104 where the mesh can include regular or irregularly arranged discontinuities in the conductive material 104. In some instances, the conductive material 104 on the sidewalls of the cavities can make electrical contact with the ground plane 122 when the PCB 102 is positioned over the substrate 105. The conductive material 104 can provide electromagnetic shielding to the microstrip transmission lines 134.

Figure 4:
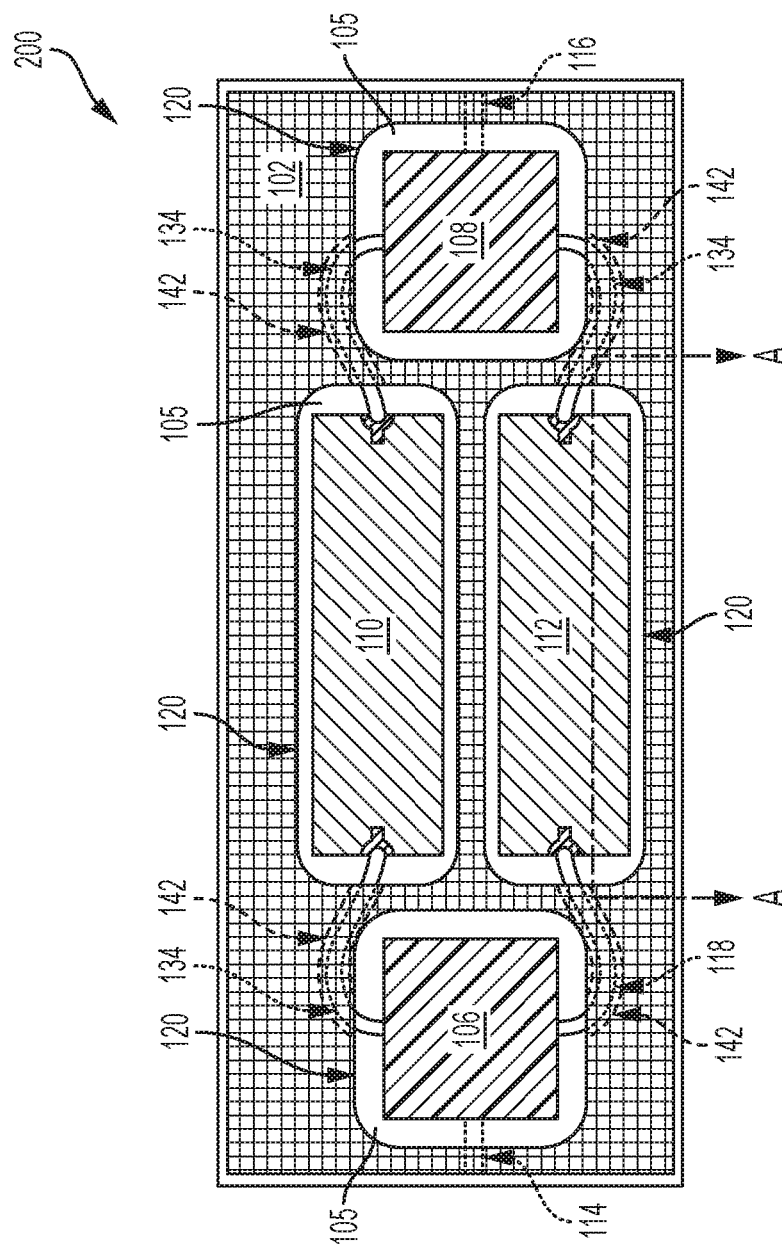
FIG. 4 shows a top view of the second example microwave device shown in FIG. 3.

FIG. 4 shows a top view of the second example microwave device 200 shown in FIG. 3. The microstrip transmission lines 134 are shown in broken lines connecting the input switch 106 to the first filter 110 and the second filter 112, and the output switch 108 to the first filter 110 and the second filter 112. In addition FIG. 4 shows an outline of the cavities 142 formed in the PCB 102. A width of the cavity 142 can be greater than a width of the respective microstrip transmission line 134 to avoid any electrical contact between the microstrip transmission line 134 and the conductive material 104 disposed on the sidewalls of the cavity 142. While not shown in FIG. 4, in some instances, the input interconnect 114 and the output interconnect 116 may also be formed using microstrip transmission lines. In such instances, the PCB 102 can include cavities that extend over the input interconnect 114 and the output interconnect 116 as well.

Figure 5:
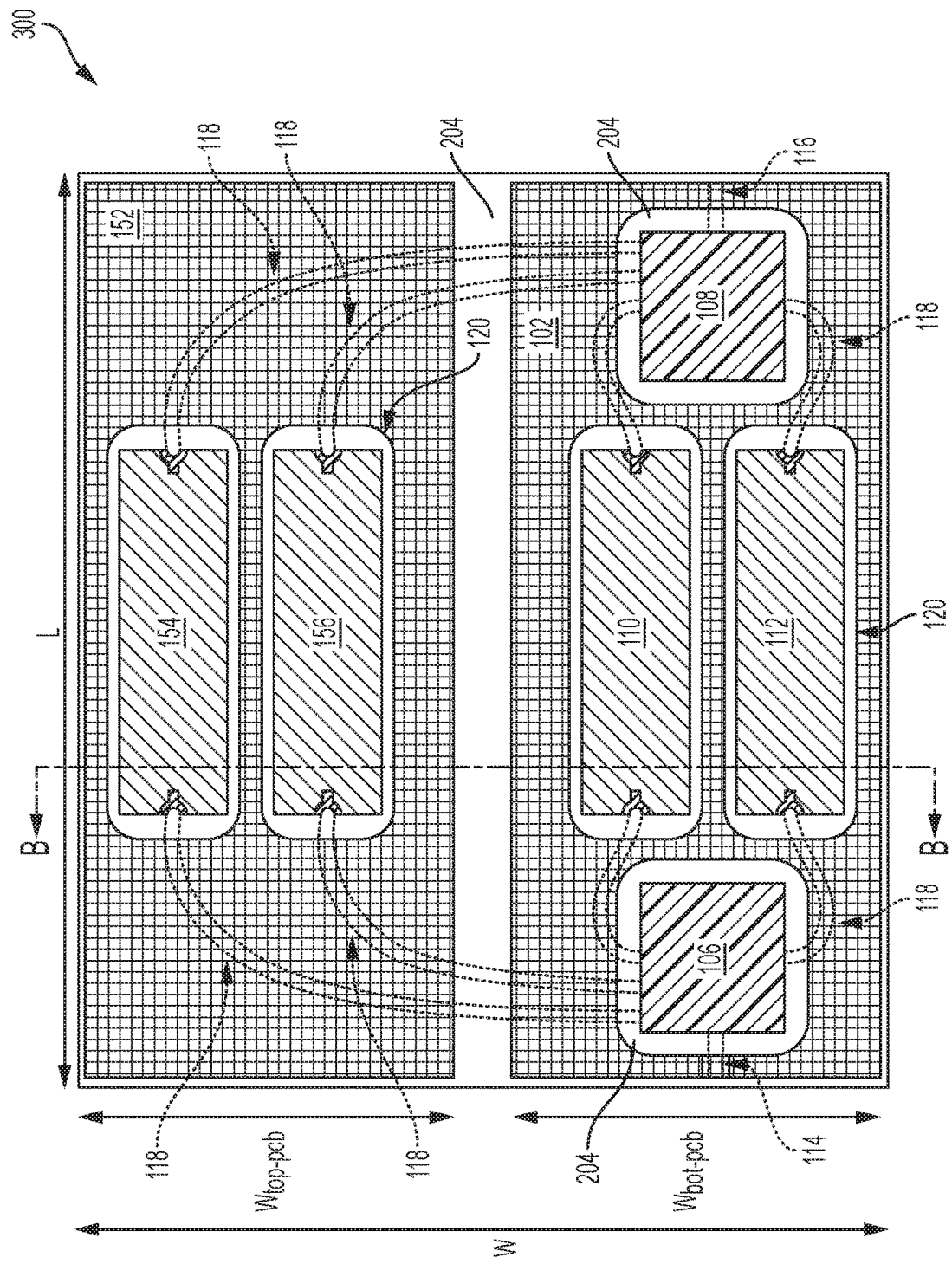
FIG. 5 shows a top view of a third example microwave device according to embodiments of the present disclosure.

FIG. 5 shows a top view of a third example microwave device 200. The third example microwave device 300 is shown without top covers, which are discussed further below. Further, the third example microwave device 300 is shown in an un-folded configuration. A folded configuration of the third example microwave device 300 is discussed below in relation to FIG. 8. The third example microwave device 300 includes a bottom PCB 102 and a top PCB 152 both of which are disposed on a substrate 204. The third example microwave device 300 is similar to the first example microwave device 100 discussed above in relation to FIG. 1 in many respects, and to the extent that the third example microwave device 300 and the first example microwave device 100 have common elements, such common elements are referred to with the same reference numerals. The bottom PCB 102 is similar to the PCB 102 shown in FIG. 1, in that like the PCB 102 of the first example microwave device 100, the bottom PCB 102 of the third example microwave device 300 also includes through-holes 120 that can accommodate the input switch 106, the output switch 108, the first filter 110, and the second filter 112. In addition, the top PCB 152 can include through-holes 120 that accommodate a third filter 154 and a fourth filter 156. The third filter 154 and the fourth filter 156 can be similar to the first and second filers 110 and 112. Furthermore, the third example microwave device 300 includes signal interconnects 118 that connect the input switch 106 and the output switch to the third filter 154 and the fourth filter 156.

The operation of the third example microwave device 300 is similar to the operation of the first example microwave device 100, in that the input switch 106 and the output switch 108 can be individually configured to select one of the four filters in the signal path of the input signal received at the input interconnect 114. While not shown in FIG. 2, the third example microwave device 300 also includes additional control terminals that can receive control signals for the configuration of the input switch 106 and the output switch 108.

The bottom PCB 102 and the top PCB 152 are disposed on a substrate 204. The substrate 204, as discussed further below, can include a flexible PCB layer 206 including stripline transmission lines or microstrip transmission lines, similar to those discussed above in relation to the substrate 105 shown in FIGS. 2 and 3.

Figure 6:
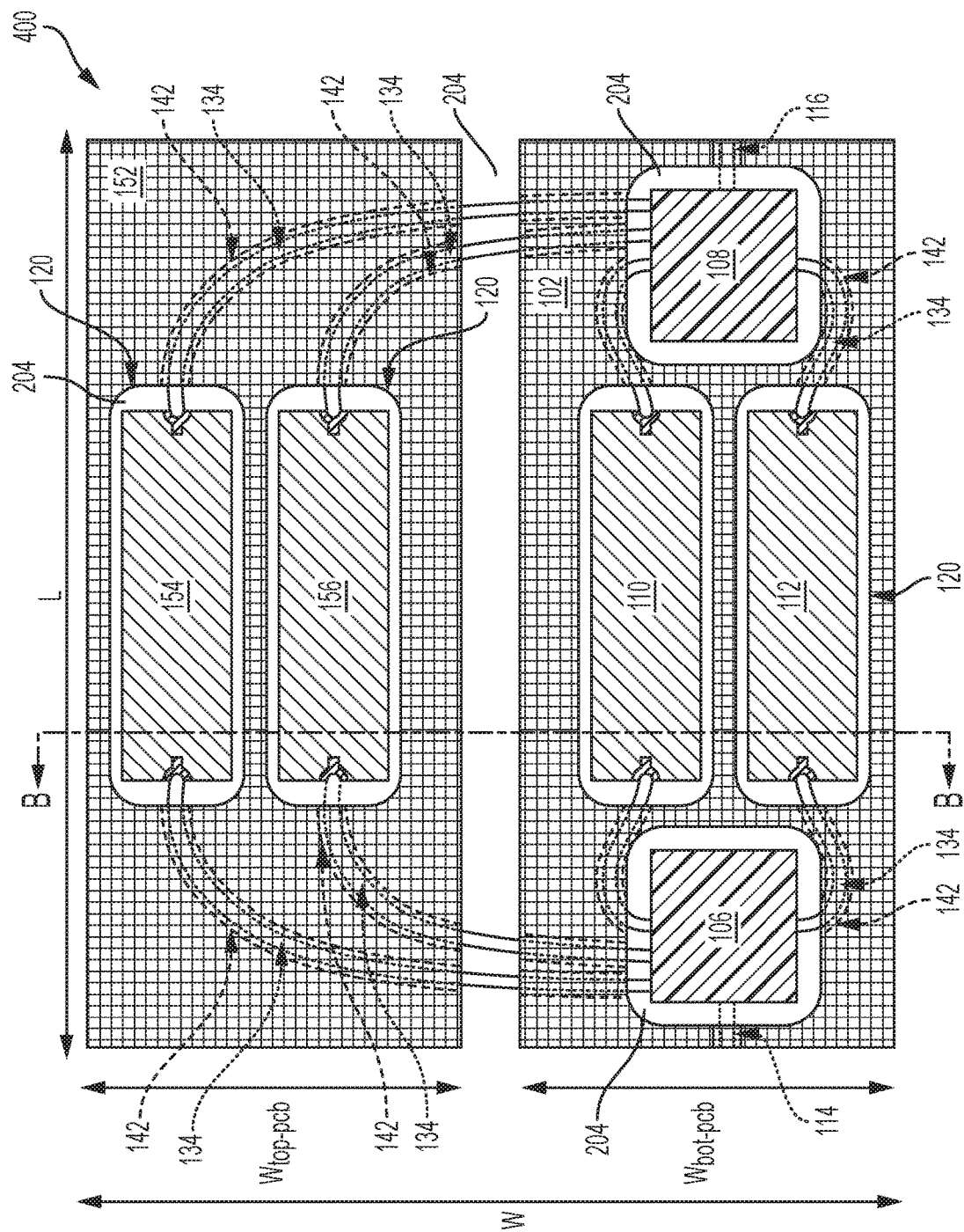
FIG. 6 shows a top view of a fourth example microwave device 400 including microstrip transmission lines, according to embodiments of the present disclosure.

FIG. 6 shows a top view of a fourth example microwave device 400 including microstrip transmission lines. The microwave device 400 shown in FIG. 6 is similar to the microwave device 300 shown in FIG. 5, except that in the fourth example microwave device 400 shown in FIG. 6, microstrip transmission lines 134 are used to implement the signal interconnects 118. As discussed above in relation to FIGS. 3 and 4, the PCB 102 can include cavities 142 that extend over the microstrip transmission lines 134. The microwave device 400 shown in FIG. 6 also includes cavities 142 formed in the top PCB 152 and the bottom PCB 102 that extend over the microstrip transmission lines 134. The cavities 142 can have the conductive material 104 disposed over at least a portion of the sidewalls of the cavities 142. The microstrip transmission lines 134 can be formed on the surface of the substrate 204, in a manner similar to that discussed above in relation to substrate 105 shown in FIGS. 3 and 4.

FIGS. 7A and 7B show a side view of the third example microwave device 300 shown in FIG. 5, and an expanded view of the bottom PCB 102. FIGS. 7A and 7B also represent a side view of the fourth example microwave device 400 shown in FIG. 6. The substrate 204 can include a bottom rigid layer 208 disposed on the side of the flexible PCB layer 206 that faces away from the bottom PCB 102 and a top rigid layer 210 on the side of the flexible PCB layer 206 that faces away from the top PCB 152. The top and bottom rigid layers 210 and 208 do not cover the entire surface of the flexible PCB layer 206. For example, a bend portion 212 of the flexible PCB layer 206 is devoid of the top and bottom rigid layers 210 and 208. Further, a bottom cover 132 covers the bottom PCB 102 and a top cover 228 covers the top PCB 152. The bottom cover 132 and the top cover 228 can be similar to the cover 132 discussed above in relation to FIG. 2. A portion of the bottom PCB 102 adjacent to the bend portion 212 can include a bottom curved surface 218. Similarly, a portion of the top PCB 152 adjacent to the bend portion 212 can include a top curved surface 220. The top and bottom rigid layers 208 and 210 can not only provide rigidity to the microwave device, but also can provide connectivity to external devices. For example, the top and bottom rigid layers 208 and 210 can include printed circuit boards with contact pads and interconnects that can allow the microwave device 200 to be connected to other circuitry or be mounted on other devices or printed circuit boards. In some implementations, the top and bottom rigid layers 208 and 210 can be made of the same material as the top and bottom PCBs 102 and 152. In some implementations, the top and bottom rigid layers 208 can include contact pads for input and output terminals, which can be used to solder surface mount the microwave device 200 on other PCBs and devices.

With regards to the example dimensions, third example microwave device 300 and the fourth example microwave device 400 can have a thickness T of about 0.04 to about 0.07 or about 0.057 inches. Each of the bottom PCB 102 and the top PCB 152 can have a thickness $T_{pcb}$ of about 0.03 to about 0.05, or about 0.04 inches. The flexible PCB layer 206 can have a thickness of about 0.0040 to about 0.012 or about 0.0080 inches. The rigid layer 208 can have a thickness $T_{rigid}$ of about 0.0040 to about 0.012 or about 0.0080 inches. The cover 132 can have a thickness $T_{cover}$ of about 0.0020 to about 0.0080 or about 0.0050 inches. Referring to FIGS. 5 and 6, the third example microwave device 300 and the fourth microwave device 400 can have a length L of about 1.3 to about 0.7 or about 1 inch, and an unfolded width W of about 0.6 to about 1.1 or about 0.88 inches. The width $W_{top\text{-}pcb}$ of the top PCB 152 can be about 0.2 to about 0.6 or about 0.4 inches. The width $W_{bot\text{-}pcb}$ of the bottom PCB 102 can be about 0.2 to about 0.6 or about 0.4 inches. In some implementations, the top and bottom PCBs can have thicknesses $T_{pcb}$ that is at least twice a thickness of an electrical component placed within the shielding cavity.

Figure 8:
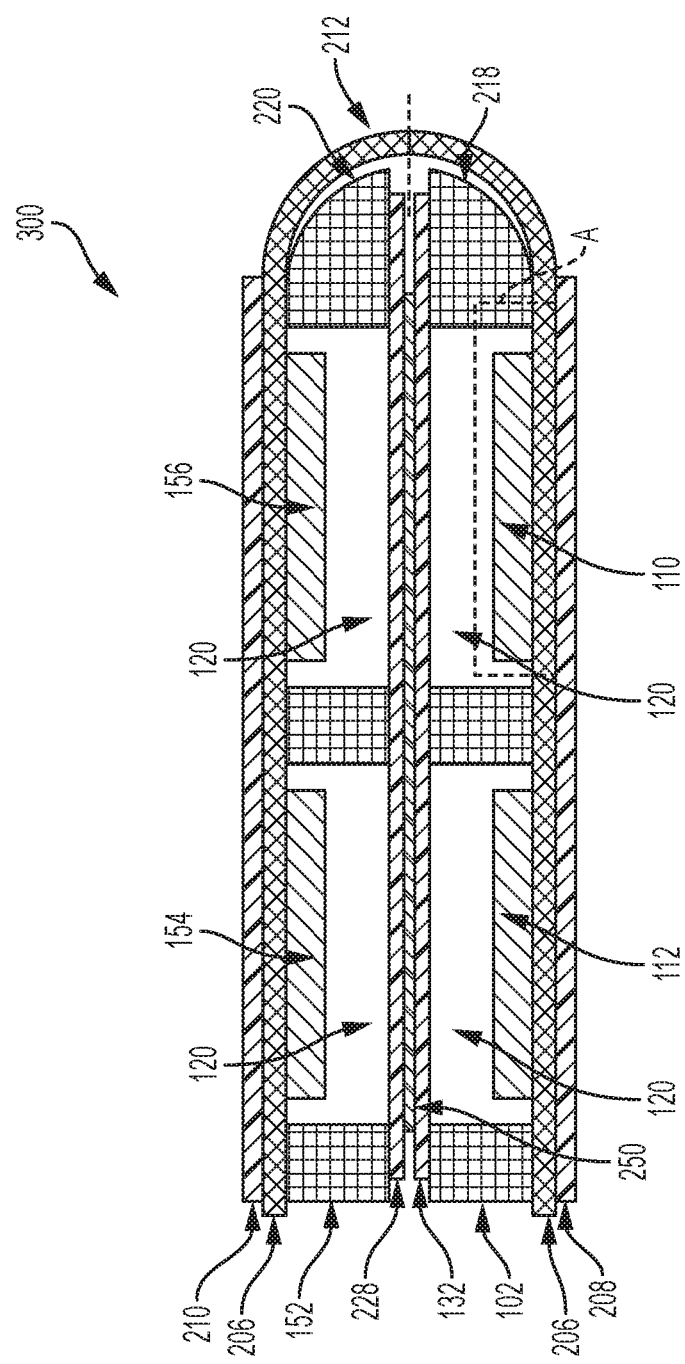
FIG. 8 shows a cross-sectional view of the third example microwave device shown in FIG. 5 in a folded configuration along axis B-B.

FIG. 8 shows a cross-sectional view of the third example microwave device 300 in a folded configuration along axis B-B shown in FIG. 5. FIG. 8 also represents a cross-sectional view of the fourth example microwave device 400 in a folded configuration along the axis B-B shown in FIG. 6. The third example microwave device 300 is folded along the bend portion of the flexible PCB layer 206, such that the top PCB 152 is positioned on top of the bottom PCB 102. Specifically, the top cover 228 and the bottom cover 132 can face each other. The flexible PCB layer 206 bends around one end of the folded third example microwave device 300 to connect the bottom PCB 102 to the top PCB 152. The bottom PCB 102 defines through-holes 120 that accommodate the first filter 110 and the second filter 112. Similarly, the top PCB 152 defines through-holes 120 that accommodate the third filter 154 and the fourth filter 156. The bottom curved surface 218 of the bottom PCB 102 can have a radius that is substantially equal to a bend radius of the bend portion 212 of the flexible PCB layer 206. Similarly, the top curved surface 220 of the top PCB 152 also can have a radius that is substantially equal to the bend radius of the bend portion 212. In some implementations, the top curved surface 220 and the bottom curved surface 218 can have a curvature that conforms to the curvature of the bend portion 212. In some implementations, the top curved surface 220 and the bottom curved surface 218 abut the bend portion 212, thereby providing support to the bend portion 212 of the flexible PCB layer 206 and reducing the risk of breakage of the flexible PCB layer 206. In some implementations, an adhesive material may also be disposed between the each of the bottom curved surface 218 and the top curved surface 220 and the bend portion 212 of the flexible PCB layer 206. In some implementations, an adhesive material 250 can be disposed between the bottom cover 132 and the top cover 228 to adhere the two covers together. In some implementations, the adhesive material 250 can include a conductive material.

Figure 9:
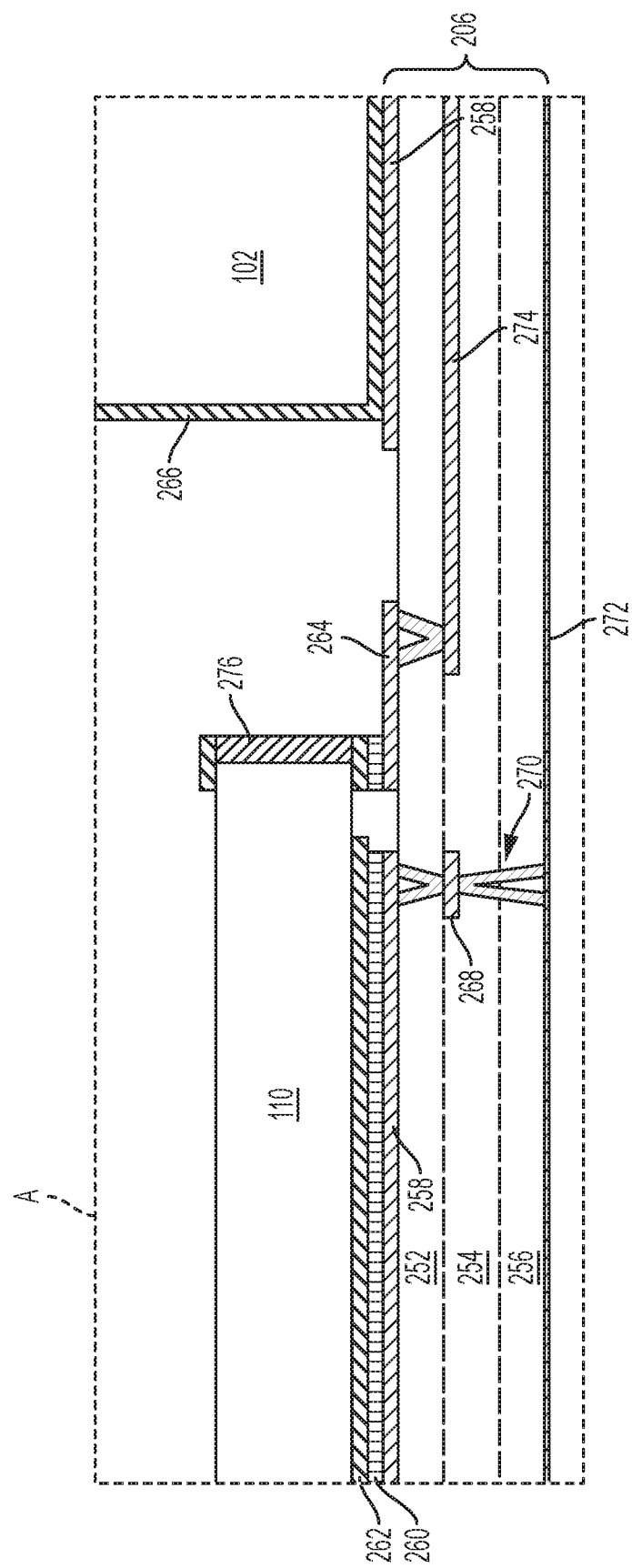
FIG. 9 shows an expanded view of a portion A of the third example microwave device shown in FIGS. 5 and 8.

FIG. 9 shows an expanded view of a portion A of the third example microwave device 300 shown in FIGS. 5 and 8. In particular, FIG. 6 shows the first filter 110 and the bottom PCB 102 disposed on a multilayered flexible PCB layer 206. The flexible PCB layer 206 includes a first dielectric layer 252, a second dielectric layer 254, and a third dielectric layer 256. On or more of these layers may be optional and can be absent, in certain implementations. A top conductive layer or a top ground plane 258 can be formed over the first dielectric layer 252. The ground plane 258 can extend substantially over the entire surface of the flexible PCB layer 206, except where apertures in the ground pane 258 are formed within which signal contact pads 264 are formed in electric isolation from the ground plane 258. The top ground plane 258 is electrically connected to the ground terminal 262 of the first filter 110. The signal contact pad 264, in turn, makes electrical contact with a signal terminal 276 of the first filter 110. The top ground plane 258 also makes contact with a conductive material 266 coated on the bottom PCB 102. The conductive material 266 is deposited on all the wall surfaces of the through-hole 120 formed in the bottom PCB 102. The conductive material 266 also covers at least a portion of both planar surfaces of the bottom PCB 102. In some implementations, a conductive adhesive or a solder 260 can be used to electrically connect the top ground plane 258 to the ground terminal 262 and to the conductive material 266 of the bottom PCB 102. The conductive adhesive or the solder 260 also can be used to electrically connect the signal contact pad 264 to the signal terminal 276 of the first filter 110.

The flexible PCB layer 206 can include a stripline 274 interconnecting impedance controlled transmission line disposed between the first dielectric layer 252 and the second dialectic layer 254. The stripline 274 can be connected to the signal contact pad 264 through vias formed in the first dielectric layer 252. The flexible PCB layer 206 can further include a bottom ground plane 272 that substantially covers the entire bottom surface of the flexible PCB layer 206. The top ground plane 258 and the bottom ground plane 272 can be electrically connected through vias and intermediate conductive layers 268. The top ground plane 258 and the bottom ground plane 272 help shield the stripline 274 from signal interference.

In one or more implementations, the first dielectric layer 252, the second dielectric layer 254, and the third dielectric layer 256 are formed using dielectric materials having low dielectric constant $\varepsilon_r$, of about 1.5 to about 3.5 or about 2.5, and low dielectric loss tangent (tan δ) value of about 0.001 to about 0.002 or about 0.0015. Having low value dielectric constant and low dielectric loss can allow the first, second, and third dielectric layers 252, 254, and 256 to have a relatively small thickness. Smaller thickness of these layers can reduce the overall thickness of the flexible PCB layer 206, which allows for a smaller bending radius of the flexible PCB layer 206. Having a small bending radius can allow building the third example microwave device 300 at even smaller thicknesses and profiles. In some implementations, example thicknesses of the first and second dielectric layers 252 and 254 can be about 0.002 to about 0.005 or about 0.003 inches. In some implementations, the thickness of the third dielectric layer 256 can be about 0.002 to about 0.005, or about 0.001 to about 0.003 or about 0.002 inches. As an example, the first, second and third dielectric layers 252, 254, and 256 can include pyralux TK materials manufactured by DUPONT®, however, other dielectric materials satisfying the above mentioned dielectric constant and dielectric loss values can be used. In some implementations, the bending radius of the flexible PCB layer 206 can be about 0.040 to about 0.070 inches. The stripline 274 can have a characteristic impedance of about 50 ohms and an RF insertion loss per inch of approximately 0.7 dB at 20 GHz.

The bottom cover 132 (shown in FIG. 5) makes electrical contact with the conductive layer 266 (shown in FIG. 6) of the bottom PCB 102 thereby making an electrical contact with the top ground plane 258. In this manner, the bottom cover 132, the conductive material 266 on the sidewalls of the bottom PCB 102, and the top ground plane 258 together can form a shielded cavity or enclosure for the first filter 110. Similarly, the top ground plane 258 and the bottom ground plane 272 can provide shielding to the stripline 274. The stripline 274 can represent the transmission lines 118 that carry the signal to and from the first filter 110. In some implementations, the stripline 274 can extend from under the bottom PCB 102 through the bend portion 212 to under one or more components on the top PCB 152. For example, the stripline 274 can be used to implement the interconnects 118 (FIG. 3) between the third and fourth filters 154 and 156 and the input and the output switches 106 and 108.

In some implementations, the bottom PCB 102 and the top PCB 152 can have a thermal coefficient of expansion that is substantially similar to that of the flexible PCB layer 206. This reduces the risk of detachment of the flexible PCB layer 206. In some implementations, the vias in the flexible PCB layer 206 can be formed using laser, and can have diameters of about 0.003 to about 0.005 or about 0.004 inches.

Figure 10:
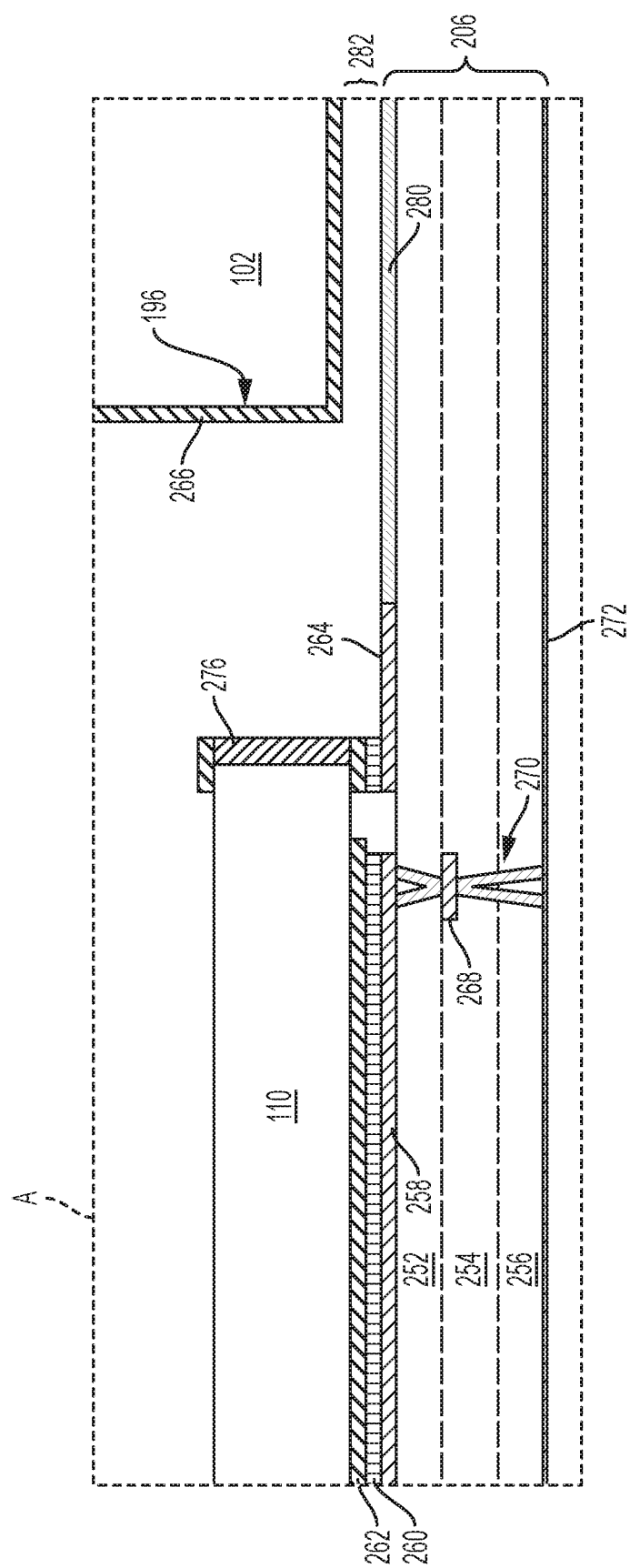
FIG. 10 shows an expanded view of a portion A of the fourth example microwave device shown in FIGS. 6 and 8.

FIG. 10 shows an expanded view of a portion A of the fourth example microwave device 400 shown in FIGS. 6 and 8. The cross-sectional view shown in FIG. 10 is similar to the cross-sectional view of the third example microwave device 300 shown in FIG. 9. To that extent, common features are referred to with the same reference numerals. The cross-sectional view shown in FIG. 10 shows a microstrip transmission line 280 disposed on the flexible PCB layer 206. The microstrip transmission line 280 is electrically coupled to the contact pad 264, which, in turn, is electrically connected to the signal terminal 276 of the first filter 110. The microstrip transmission line 280 can be used to implement the microstrip transmission line 134 shown in the top view of the fourth example microwave device 400. FIG. 10 also shows a cavity or tunnel 282 defined by the bottom PCB 102 and the flexible PCB layer 206. The cavity 282 can be similar to the cavity 142 discussed above in relation to FIG. 3, and can include sidewalls that are at least partially coated with the conductive material 266 to provide shielding to the microstrip transmission line 280.

Figure 11:
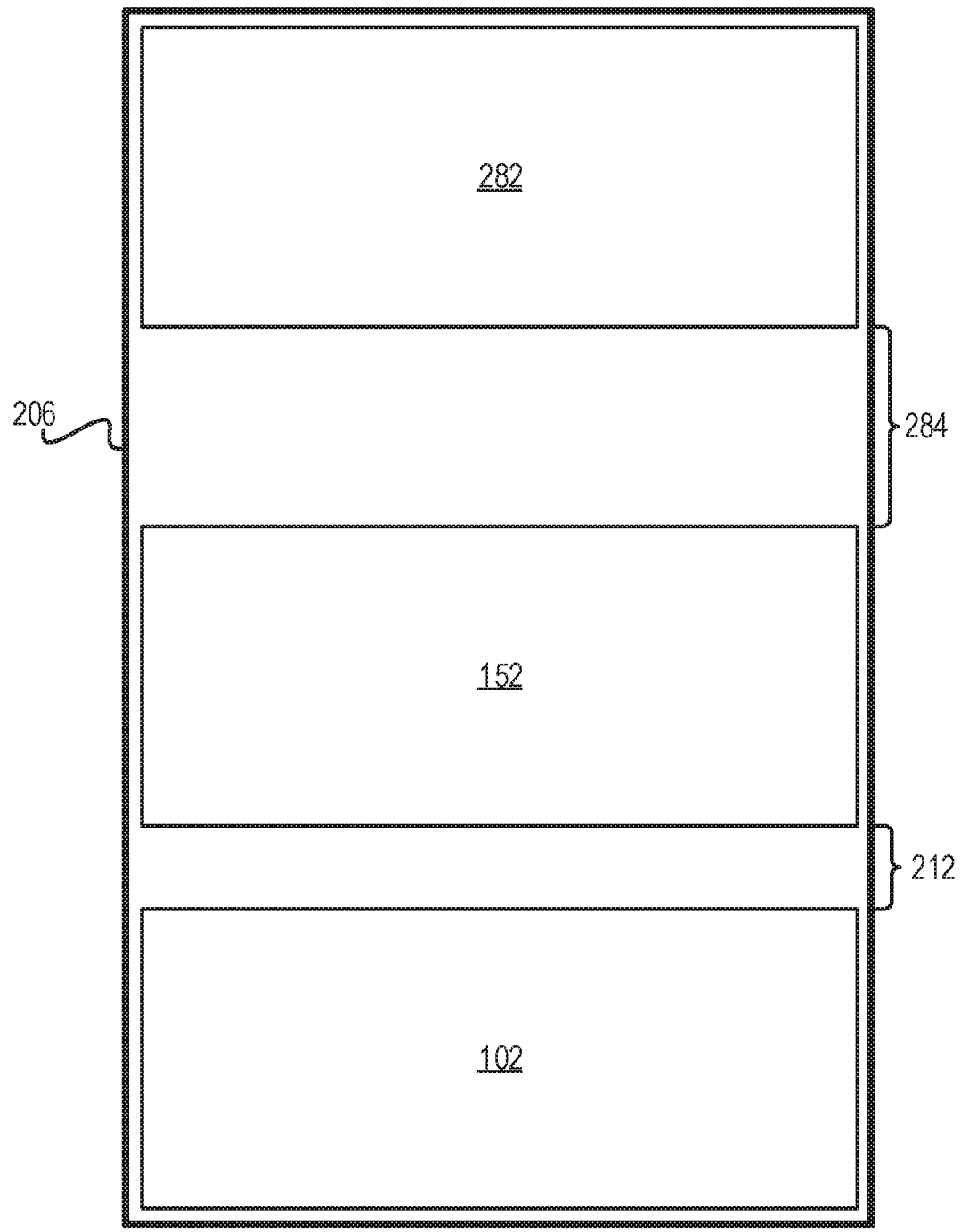
FIGS. 11 and 12 show block diagrams of an unfolded and a folded microwave device including three stackable PCBs.
Figure 12:
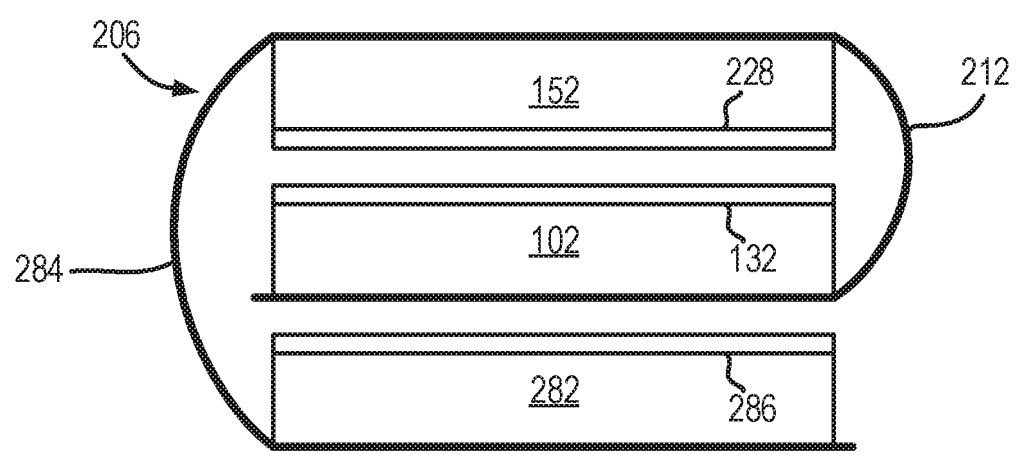

FIGS. 11 and 12 show block diagrams of an unfolded and a folded, respectively, microwave device 280 including three stackable PCBs. Referring again to FIG. 8, in some implementations, the third example microwave device 300 and the fourth example microwave device 400 can include one or more PCBs in addition to the bottom PCB 102 and the top PCB 152. For example, as shown in FIG. 11, the microwave device 280 can include a third PCB 282, positioned on the flexible PCB layer 206 spaced apart from the top PCB 152. The third PCB 282 can be similar to the bottom PCB 102 and the top PCB 152 discussed above. As shown in FIG. 12, the third PCB 282 can be stacked under the bottom PCB 102. The flexible PCB layer 206, which in FIG. 8 terminates under the top PCB 152, can instead form an additional bend region 284, which can extend out to the left, bend downwards, and connect to the third PCB 282 stacked under the bottom PCB 102. In some such arrangements, the additional bend portion 284 can have an area that is greater than the area of the bend portion 212. The larger area of the additional bend portion 284 allows the additional bend portion to traverse a larger distance to allow the third PCB 282 to be stacked under the bottom PCB 102. The third PCB 282 includes a third cover 286, that in the position shown in FIG. 12, is facing the bottom PCB 105, and top rigid layer of the third PCB 282 faces the bottom rigid layer 208 of the bottom PCB 102. In another example arrangement, the third PCB 282 can be positioned spaced apart from the bottom PCB 102, instead of being positioned spaced apart from the top PCB 152, as shown in FIG. 11, such that the additional bend portion extends between the bottom PCB 102 and the third PCB 282. In such arrangements, the third PCB can be stacked below the bottom PCB 102 such that the cover 286 can face away from the bottom PCB 102. In such an arrangement, the three PCBs along with the flexible PCB layer 206 can approximately form a "Z" shape. In such manner, multiple PCBs can be stacked, where each PCB is connected to another PCB in the stack through the flexible PCB layer. The stacking of the PCBs allows including a large number of microwave components within the same footprint, thereby increasing device density.

Figure 13:
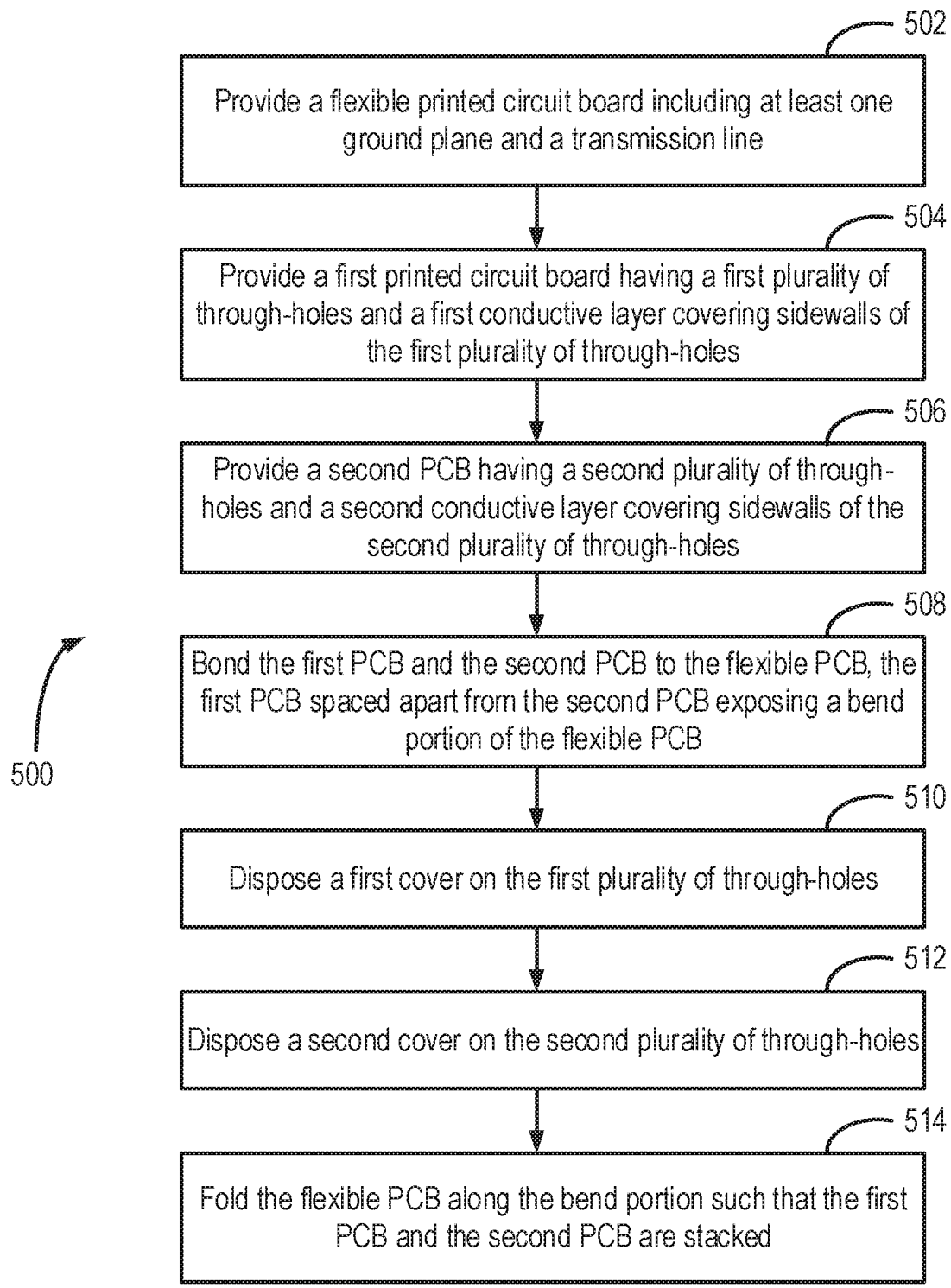
FIG. 13 shows a flow diagram for a process of manufacturing a microwave device, according to embodiments of the present disclosure.

FIG. 13 shows a flow diagram for a process 500 of manufacturing a microwave device. The process includes providing a flexible printed circuit board including at least one ground plane and at least one transmission line (stage 502). One example of this process stage has been discussed above in relation to FIGS. 5-12 where the flexible PCB layer 206 includes a top ground plane 258, a bottom ground plane 272 and a stripline 274 transmission line or a microstrip transmission line 280. As discussed above, the flexible PCB layer 206 can be formed using multiple layers of dielectric material having low dielectric constant and low dielectric loss. Stripline transmission lines 274 can be included between any two of the dielectric layers. Microstrip transmission lines 280 can be formed on top of the first dielectric layer 252 using patterning techniques. The flexible PCB layer 206 can also include contact pads for making electrical contact with circuit components mounted thereon, as well as laser formed vias that connect the contact pads to underlying striplines or to other ground planes. In one example, the flexible PCB layer 206 can be provided with a thickness of about 0.006 to about 0.01 inches and have a bending radius of about 0.040 to about 0.070 inches.

The process 500 further includes providing a first PCB having a first plurality of through-holes and a first conductive layer covering sidewalls of the first plurality of through-holes (stage 504). One example of this method stage has been discussed above in relation to FIGS. 5-12, where the bottom PCB 102 includes a plurality of through-holes 120. The bottom PCB 102 can be a double cladded PCB, which includes a metal coating both the top and bottom surfaces of the PCB. Each of the plurality of through-holes 120 can be formed using photolithography techniques, chemical etching, machining (e.g., routing or milling), or a laser cutting process. The sidewalls of each of the through-holes 120 can be chemically activated, and coated with a conductive material such as copper or aluminum. In some implementations, the sidewalls of the through-holes 120 can be coated with the conductive material using PCB processes for forming metallized vias in the PCB.

The process 500 additionally includes providing a second PCB having a second plurality of through-holes and a second conductive layer covering sidewalls of the second plurality of through-holes (stage 506). One example of this process stage has been discussed above in relation to FIGS. 5-12. For example, as shown in FIGS. 5-10, the top PCB 152 is provided with a plurality of through-holes 120. The second PCB can be formed in a manner similar to that discussed above in relation to the first PCB.

In some instances, where microstrip transmission lines are used (such as the microstrip transmission lines 134 and 280 shown in FIGS. 6 and 10) cavities can be formed in both the first PCB and the second PCB that have a pattern such that when the first and the second PCB are bonded to the flexible PCB, the cavities extend over the microstrip transmission lines. In some examples, the cavities 142 can be formed in the bottom surface 194 of the PCB 102 using photolithography techniques, chemical etching, machining (e.g., routing or milling), or a laser cutting process. As an example, the cavities 142 can be formed on the bottom surface 194 of the PCB 102 such that they extend laterally form the sidewall 196. In some instances, widths of the cavities 142 can be selected to be greater than the width of the microstrip transmission lines 134. In addition, at least a portion of the sidewalls of cavities 142 can be coated with the conductive material to provide shielding to the microstrip transmission lines. The conductive material can be deposited on the walls of the cavities using metal deposition techniques such as electroplating, sputtering, evaporation, and the like.

The process 500 also includes bonding the first PCB and the second PCB to the flexible PCB (stage 508). One example of this process stage has been discussed above in relation to FIGS. 5-12, where the bottom PCB 102 and the top PCB 152 are bonded onto the flexible PCB layer 206. The bottom PCB 102 and the top PCB 152 are spaced apart to expose a bend portion 212 of the flexible PCB layer 206. In some implementations, a solder reflow process can be used to physically and electrically bond the conductive surfaces of the bottom PCB 102 and the top PCB 152 to the ground plane contact pads on the flexible PCB layer 206. In some other implementations, a conductive adhesive can be used to physically and electrically bond the bottom PCB 102 and the top PCB 152 to the flexible PCB layer 206.

The process 500 further includes disposing a first cover on the first plurality of through-holes (510) and disposing a second cover on the second plurality of through-holes (512). At least one example of these process stages has been discussed above in relation to FIGS. 5-12. For example, FIGS. 7A, 7B and 8 show a bottom cover 132 disposed over the through-holes 120 in the bottom PCB 102 and a top cover 228 disposed over the through-holes 120 in the top PCB 152. In some instances, the bottom cover 132 and the top cover 228 completely cover the respective through-holes. In some examples, the bottom cover 132 and the top cover 228 can only partially cover the respective through-holes. In some instances the bottom cover 132 and the top cover 228 can be bonded to the respective PCB such that the covers make electrical contact with the conductive material 266 that is deposited over the sidewalls of the through-holes and over a portion of the top and bottom surfaces around the rim edges 190 of the though holes 120. The covers can be bonded to their respective PCBs using solder or a conductive adhesive.

The process 500 also includes folding the flexible PCB layer along the bend portion such that the first PCB and the second PCB are stacked (stage 514). As shown in FIG. 8, the flexible PCB layer 206 is folded or bent at the bend portion 212 such that the top PCB 152 is stacked over the bottom PCB 102. The PCBs are stacked, which can reduce a footprint of the microwave device. Also as shown in FIG. 12 a third PCB 282 can be stacked below the bottom PCB 102 and can include another bend portion 284, which can be folded to stack the third PCB 282 below the bottom PCB 102.

In some instances, the process 500 can further include placing circuit components within the through-holes on the flexible PCB layer. One example of this process has been discussed above in relation to FIGS. 6-10. For example, the circuit components such as the input switch 106, the output switch 108, and the plurality of filters 110, 112, 154, and 156 are placed on the flexible PCB layer 206 within their respective through-holes 120. The circuit components can be bonded to the flexible PCB layer 206 using a soldering process or by using a conductive adhesive. The components can be placed such that the ground terminal and signal terminal of each circuit component is in proper electrical contact with the corresponding contact pads on the flexible PCB layer 206.

In some implementations, the circuit components may be placed on the flexible PCB layer 206 prior to the bonding of the top and bottom PCBs 152 and 102 to the flexible PCB layer 206. This may provide a benefit of having easy access to the circuit components while they are bonded to the flexible PCB layer 206.

In some implementations, the process can further include singulation of individual microwave devices from a panel of multiple microwave devices formed as a panel. For example, the flexible PCB 206 can be formed with interconnects, ground planes, and contact pads associated with multiple microwave devices. The flexible PCB 206 can include multiple portions, for example, arranged in rows and columns, where each portion includes interconnects ground planes and contact pads associated with one microwave device. Similarly, a panel PCB can have multiple portions associated with multiple microwave devices, and positioned to align with corresponding portions on the flexible PCB 206. For example, each portion of the panel PCB representing a single microwave device, can include sub-portions that correspond to the bottom PCB 102 and the top PCB 152. The panel PCB can also include cut-outs positioned between the sub-portions that expose the bend portion 212 of the flexible PCB 206 when the panel PCB is bonded to the flexible PCB 206. The sub-portions that correspond to the bottom PCB 102 and top PCB 152 can include through-holes 120 with conductive material 104 disposed at least on their sidewalls. The panel PCB can be patterned using typical PCB formation processes such as photolithography, chemical etching, laser cutting and machining.

Similarly, a cover material having multiple portions corresponding to multiple microwave devices can be bonded to the panel PCB. Each portion of the cover that corresponds to a microwave device can include sub-portions corresponding to the top cover 228 and the bottom cover 132. The cover may also include cut-outs that correspond to the cut-outs on the panel PCB that can expose the bend portion 212 on the flexible PCB 206. Individual microwave devices can be singulated by cutting the panel PCB, the flexible PCB 206 and the cover.

The electrical components associated with each of the microwave devices defined by the flexible PCB 206 and the panel PCB can be disposed on the flexible PCB 206 before or after the bonding of the panel PCB on the flexible PCB 206. Further, the electrical components can be bonded to the flexible PCB 206 before or after singulation.

In some implementations, the process can further include bonding the top rigid layer 210 and the bottom rigid layer 208 to the flexible PCB layer 206. In some implementations, a PCB material can be bonded to the flexible PCB layer 206 and then patterned using patterning techniques such as photolithography, chemical etching, machining, and laser cutting to cut out the PCB layer near the bend portion 212 to form the top rigid layer 210 and the bottom rigid layer 208. In some instances, the flexible PCB 206 can be formed with a rigid layer that includes portions that correspond to multiple microwave devices, where each portion include sub-portions corresponding to the top rigid layer 210 and the bottom rigid layer 208. The rigid layer can be bonded to the flexible PCB on a surface that is opposite to the surface on which the PCB panel is bonded. During singulation, the rigid layer is can be cut simultaneously with the panel PCB, the flexible PCB 206 and the cover to form the top rigid layer 210 and the bottom rigid layer 208 of each microwave device. The singulated microwave devices can then be individually folded along their respective bend portion 212 to form individual stacked microwaved devices.

In some implementations, the first PCB 102 and the second PCB 152 can be replaced with metal boards. In some such implementations, the metal boards can have through-holes 120, but may not include the conductive coating 104, as the metal board itself would provide a conductive path between the covers and the ground plane of the substrate 105 or the flexible PCB layer 206.

Figure 14:
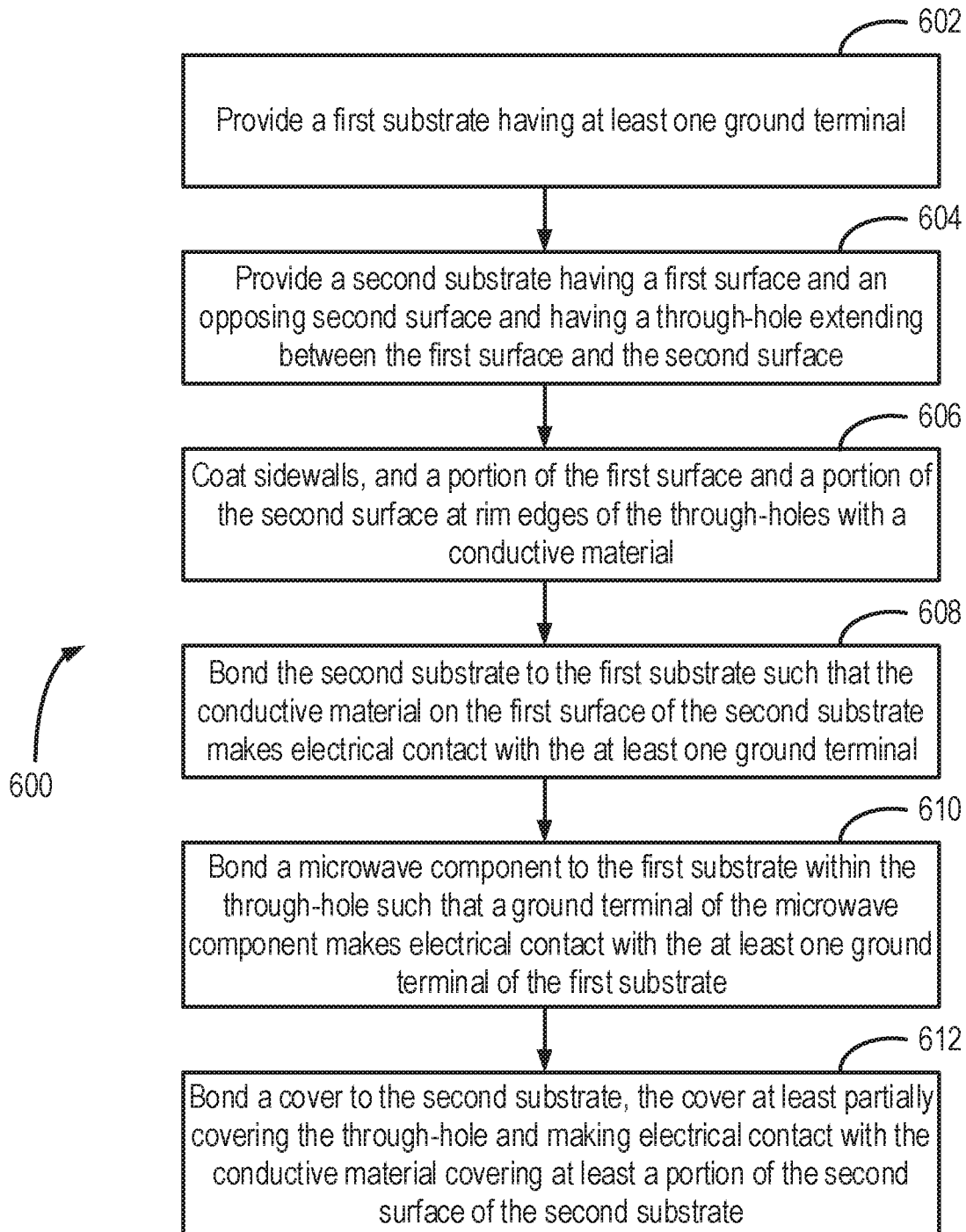
FIG. 14 shows a flow diagram of another process of manufacturing a microwave device, according to embodiments of the present disclosure.

FIG. 14 shows a flow diagram of another process 600 of manufacturing a microwave device. The process 600 includes providing a first substrate having at least one ground terminal (602). At least one example of this process stage has been discussed above in relation to FIGS. 1-10. For example, FIGS. 1-4 show a substrate 105 having a ground terminal 128. The substrate can include a top ground plane 122, a bottom ground plane 124, and a dielectric layer 140 positioned there between. The substrate 105 can be formed using any metal deposition technique that can be used to deposit and pattern metal layers on both opposing surfaces of the substrate 105. The patterning can form contact pads 126 and the ground terminals 128 for connection to electrical components. In some instances, the patterning process can also pattern microstrip transmission lines 134 connecting contact pads or ground terminals formed on the substrate 105. The substrate 105 can also include stripline transmission lines 118 that are positioned such that at least a portion of the stripline transmission lines 118 is covered by the dielectric material 140.

The process 600 further includes providing a second substrate having a first surface and an opposing second surface and having a through-hole extending between the first surface and the second surface (604). At least one example of this process stage has been discussed above in relation to FIGS. 1-10. For example, as shown in FIGS. 2 and 3, the PCB 102 includes through-holes 120 extending between a first surface (the top surface 192) and a second surface (the bottom surface 194) of the PCB 102. The through-holes can be formed using photolithography techniques, chemical etching, machining (e.g., routing or milling), or a laser cutting process.

The process 600 further includes coating sidewalls and a portion of the first surface and a portion of the second surface at rim edges of the through-holes with a conductive material (606). At least one example of this process stage has been discussed above in relation to FIGS. 1-10. For example, as shown in FIGS. 2 and 3, a conductive material 104 can be deposited over the sidewalls 196 and at least a portion of the top surface 192 and the bottom surface 194 near the rim edges 190 of the PCB 102. In some examples, the sidewalls 196 of each of the through-holes 120 and the top and bottom surfaces 192 and 194 of the PCB 102 can be chemically activated and coated with a conductive material 104 such as copper or aluminum. In some implementations, the sidewalls 196 of the through-holes 120 and portions of the top and bottom surface 192 and 194 can be coated with the conductive material 104 using PCB processes for forming metallized vias in the PCB.

The process 600 also includes bonding the second substrate to the first substrate such that the conductive material on the first surface of the second substrate makes electrical contact with the at least one ground terminal (608). At least one example of this process stage has been discussed above in relation to FIGS. 1-10. For example, FIGS. 2 and 3 show the PCB 102 bonded to the substrate 105, such that the conductive material 104 on the PCB 102 makes electrical contact with the ground plane or terminal 122. In some examples, a solder reflow process can be used to physically and electrically bond the conductive surfaces of the PCB 102 to the ground plane or terminal 122 of the substrate 105. In some examples, a conductive adhesive also can be used.

The process 600 also includes bonding a microwave component to the first substrate within the through-hole such that a ground terminal of the microwave component makes electrical contact with the at least one ground terminal of the first substrate (610). At least one example of this process stage has been discussed above in relation to FIGS. 1-10. For example, FIGS. 1-5 show circuit components such as the input switch 106, the output switch 108, and the plurality of filters 110 and 112 placed on the substrate 105 within their respective through-holes 120. The circuit components can be bonded to the flexible PCB layer 206 using a soldering process or by using a conductive adhesive. The components can be placed such that the ground terminal and signal terminal of each circuit component is in proper electrical contact with the corresponding contact pads on the substrate 105. In some examples, the circuit components may be placed on the substrate 105 prior to the bonding of the PCB 102 to the substrate 105. This may provide a benefit of having easy access to the circuit components while they are bonded to the substrate 105.

The process 600 also includes bonding a cover to the second substrate, the cover at least partially covering the through-hole and making electrical contact with the conductive material covering at least a portion of the second surface of the second substrate (612). At least one example of this process stage has been discussed above in relation to FIGS. 1-10. For example, FIGS. 2 and 3 show a cover 132 bonded to the top surface 192 of the PCB 102. The cover 132 makes electrical contact with the conductive material 104 covering at least a portion of the top surface 192 of the PCB 102. The cover 132 completely covers the through-hole 120. However, in some examples, the cover 132 may partially cover the through-hole 120. The cover 132, the conductive material 104 on the sidewalls 196, and the ground plane or terminal 122 provide shielding to the electrical component 112, thereby improving the performance of the electrical component 112.

In some instances, the process 600 can further include singulation to form individual devices. For example, the substrate 105 can include multiple portions corresponding to multiple devices, where each portion can include ground planes, interconnects, and contact pads associated with each device. The PCB 102 can be a panel PCB and can include multiple portions that correspond to multiple devices, where each portion can include through-holes 120 with at least conductive sidewalls. The panel PCB can be bonded to the substrate 105 such that individual device portions on the panel PCB align with corresponding device portions on the substrate 105. A cover that also includes multiple regions corresponding to multiple devices, and can be bonded to the panel PCB. Individual devices can be singulated by cutting the cover, the PCB, and the substrate 105 appropriately between portions that correspond to individual devices.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microwave device comprising:
 a flexible member;
 a first material layer including a first through-hole, the first material layer bonded to the flexible member;
 a microwave component mounted on the flexible member within the first through-hole;

a first conductive cover covering the first through-hole of the first material layer and electrically connected to a first conductive portion of the first material layer to shield the microwave component;

a second material layer including a second through-hole, the second material layer bonded to the flexible member and spaced apart from the first material layer by a bendable portion of the flexible member; and an electrical component mounted on the flexible member within the second through-hole, wherein the second material layer is stacked relative to the first material layer when the flexible member is folded along the bendable portion.

2. The microwave device of claim 1, further comprising a first rigid layer disposed on a side of the flexible member opposing to a side on which the first material layer is disposed.

3. The microwave device of claim 1, further comprising a second conductive cover covering the second through-hole of the second material layer and electrically connected to a second conductive portion of the second material layer to shield the electrical component.

4. The microwave device of claim 3, further comprising an adhesive layer disposed between, and fastening, the first conductive cover and the second conductive cover.

5. The microwave device of claim 1, wherein the first material layer includes a first curved portion adjacent to the bendable portion of the flexible member when the flexible member is folded along the bendable portion, and the second material layer includes a second curved portion adjacent to the bendable portion of the flexible member when the flexible member is folded along the bendable portion.

6. The microwave device of claim 5, wherein the first curved portion and the second curved portion conform to a curvature of the bendable portion of the flexible member when the flexible member is folded along the bendable portion.

7. The microwave device of claim 5, further comprising an adhesive layer disposed between the first curved portion of the first material layer and the bendable portion of the flexible member when the flexible member is folded along the bendable portion.

8. The microwave device of claim 1, wherein the flexible member comprises:

a signal terminal coupled to the microwave component by an impedance controlled transmission line, and a dielectric material covering at least a portion of the impedance controlled transmission line.

9. The microwave device of claim 8, wherein the flexible member has a first ground plane and a second ground plane, wherein the impedance controlled transmission line is disposed between the first ground plane and the second ground plane.

10. The microwave device of claim 1, wherein the flexible member comprises a signal terminal coupled to the microwave component by an impedance controlled transmission line.

11. The microwave device of claim 1, wherein a thermal expansion coefficient of the first material layer, the second material layer and the flexible member are equal.

12. The microwave device of claim 1, wherein the bendable portion is a first bendable portion, the microwave device further comprising:

a third material layer including a third through-hole, the third material layer bonded to the flexible member and spaced apart from the second material layer exposing a second bendable portion of the flexible member;

another electrical component mounted on the flexible member within the third through-hole; and wherein the third material layer is stacked below the first material layer and the second material layer when the flexible member is folded along the second bendable portion.

13. The microwave device of claim 12, wherein an area of the second bendable portion is greater than an area of the first bendable portion.

14. The microwave device of claim 1, wherein the microwave component and the of electrical component have a thickness between 0.045 inches and 0.055 inches.

15. A microwave device comprising:

a flexible member including a signal terminal coupled to an impedance controlled transmission line;

a first material layer including a first recess, the first material layer coupled to the flexible PCB;

a microwave component disposed in the first recess and mounted on the flexible member, the microwave component electrically coupled to the signal terminal by the impedance controlled transmission line;

a second material layer including a second recess, the second material layer coupled to the flexible member and spaced apart from the first material layer by a bendable portion of the flexible member; and an electrical component disposed in the second recess and mounted on the flexible member, wherein the first material layer is stacked relative to the second material layer when the flexible member is folded along the bendable portion.

16. The microwave device of claim 15, wherein the first material layer includes a cavity extending over at least a portion of the impedance controlled transmission line, wherein a wall portion of the cavity has a conductive surface.

17. The microwave device of claim 15, wherein the flexible member includes a ground plane, and the first material layer includes a dielectric layer separating the impedance controlled transmission line from the one ground plane.

18. The microwave device of claim 17, wherein the dielectric layer has a dielectric constant between 1.5 and 3.5.

19. The microwave device of claim 17, wherein the dielectric layer has a dielectric loss tangent value between 0.001 and 0.002.

20. A microwave device comprising:

a flexible member;

a first material layer including a first curved surface portion and a first through-hole, the first material layer coupled to the flexible member;

a microwave component disposed in the first recess and mounted on the flexible member;

a second material layer including a second curved surface portion and a second recess, the second material layer coupled to the flexible member and spaced apart from the first material layer by a bendable portion of the flexible member; and an electrical component disposed in the second recess and mounted on the flexible member, wherein the first material layer is stacked relative to the second material layer and the first curved portion and the second curved portion are fastened to the bendable portion when the flexible member is folded along the bendable portion.

* * * * *